US009674942B2

(12) United States Patent
Kasahara et al.

(10) Patent No.: US 9,674,942 B2
(45) Date of Patent: Jun. 6, 2017

(54) STRUCTURE, WIRING BOARD AND ELECTRONIC DEVICE

(71) Applicant: NEC CORPORATION, Tokyo (JP)

(72) Inventors: Yoshiaki Kasahara, Tokyo (JP); Hiroshi Toyao, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/773,090

(22) PCT Filed: Feb. 24, 2014

(86) PCT No.: PCT/JP2014/054279
§ 371 (c)(1),
(2) Date: Sep. 4, 2015

(87) PCT Pub. No.: WO2014/136595
PCT Pub. Date: Sep. 12, 2014

(65) Prior Publication Data
US 2016/0014887 A1 Jan. 14, 2016

(30) Foreign Application Priority Data
Mar. 8, 2013 (JP) .................................. 2013-047034

(51) Int. Cl.
*H04B 3/28* (2006.01)
*H05K 1/02* (2006.01)
*H05K 1/11* (2006.01)

(52) U.S. Cl.
CPC ........... *H05K 1/0236* (2013.01); *H05K 1/115* (2013.01); *H05K 2201/09236* (2013.01)

(58) Field of Classification Search
CPC ................. H05K 1/0236; H05K 1/115; H05K 2201/09236
(Continued)

(56) References Cited

U.S. PATENT DOCUMENTS 7,136,029 B2 * 11/2006 Ramprasad .............. H01Q 1/22
343/700 MS
7,215,007 B2 5/2007 McKinzie, III et al.

FOREIGN PATENT DOCUMENTS

JP 07-249902 A 9/1995
JP 2010-010183 A 1/2010
(Continued)

OTHER PUBLICATIONS

International Search Report of PCT/JP2014/054279 dated May 13, 2014.

*Primary Examiner* — Robert Pascal
*Assistant Examiner* — Kimberly Glenn
(74) *Attorney, Agent, or Firm* — Sughrue Mion, PLLC

(57) ABSTRACT

A structure comprising: a first and a second conductor planes which are arranged in different layers and in a manner to face to each other; a first transmission line (103) which is arranged in a different layer from those of the first conductor plane and of the second conductor plane, faces to the second conductor plane, and has its one end being an open end; a first conductor via (104) which connects the other end of the first transmission line (103) with the first conductor plane; a second transmission line (105) which is formed in the same layer as that of the first transmission line, runs parallel to the first transmission line (103), and has its one end being an open end; and a second conductor via (106) which electrically connects the other end of the second transmission line (105) with either of the first and second conductor planes.

12 Claims, 44 Drawing Sheets

(58) Field of Classification Search
USPC .......................................................... 333/12
See application file for complete search history.

(56) References Cited

FOREIGN PATENT DOCUMENTS

| | | |
|---|---|---|
| JP | 2010-199881 A | 9/2010 |
| JP | 2011-165824 A | 8/2011 |

\* cited by examiner

EQUIVALENT CIRCUIT OF OPEN
STUB (FIRST TRANSMISSION
LINE) IN THE VICINITY OF BAND
GAP START FREQUENCY

EQUIVALENT CIRCUIT OF NEWLY
ADDED RESONATOR
(SECOND TRANSMISSION LINE 105)

STRUCTURE, WIRING BOARD AND ELECTRONIC DEVICE

CROSS REFERENCE TO RELATED APPLICATIONS

This is a National Stage of International Application No. PCT/JP2014/054279 filed Feb. 24, 2014, claiming priority based on Japanese Patent Application No. 2013-047034, filed on Mar. 8, 2013, the contents of all of which are incorporated herein by reference in their entirety.

TECHNICAL FIELD

The present invention relates to a structure employed in devices using microwaves or millimeter waves, a wiring board comprising the structure, and an electronic device employing the wiring board.

BACKGROUND ART

In an electronic device in which a plurality of conductor planes are present, an electromagnetic wave is generated as a result of, for example, induction of a magnetic field by electric current flowing into a circuit at a time of switching of a digital circuit, or induction of an electric field by voltage fluctuation occurring at a time of the switching. Such an electromagnetic wave becomes into electromagnetic noise propagating through a parallel plate line constituted by the conductor planes. Such electromagnetic noise causes problems of destabilizing the circuit operation, deteriorating the wireless performance of the device, or the like. It means that the circuit stability and the device's wireless performance can be improved by establishing technology for suppressing the electromagnetic noise.

Conventional methods having been used for solving the above-described problems include a method of inserting a decoupling capacitor between the conductor planes, a method of avoiding formation of a large island-shaped conductor plane, and the like. However, these methods have the following problems, respectively.

In the method using a decoupling capacitor, it is difficult to achieve a self-resonant frequency as high as hundreds of MHz owing to an unavoidable parasitic inductance of the capacitor. Therefore, in general, the method using a decoupling capacitor can be applied for only frequencies up to about hundreds of MHz, and cannot cope with a higher frequency range such as that used in recent wireless communication (for example the 2.4 GHz band or the 5.2 GHz band).

The method of avoiding formation of a large island-shaped conductor plane is based on shifting the resonance of a conductor plane to the higher frequency side by diminishing the size of the conductor plane. However, in practical cases, conductor planes of the same electric potential need to be DC connected with each other. Because widening a part for the connection causes the conductor planes not to be small in size, the connection part needs to be narrow. However, narrowing the connection part increases the self-inductance of the corresponding part, which results in increase in a voltage drop at a time of current inflow due to switching. Therefore, there is a practical limit on diminishing the size of the conductor planes.

As a method for solving those problems, for example, one described in Patent Literature 1 will be mentioned. A structure described in Patent Literature 1 is one having an EBG (electromagnetic bandgap) characteristic (hereafter, described as an EBG structure), which is aimed at suppressing propagation of electromagnetic wave noise between power planes. By using the EBG structure, an electromagnetic noise suppression effect can be attained in a GHz range. Further, because no manipulation of the power planes is made unlike a method of separating the conductor planes into small islands, the method of Patent Literature 1 does not cause increase in the self-inductance of the power planes.

Technologies relating to the above-described one are disclosed in Patent Literature 3 and Patent Literature 4.

CITATION LIST

Patent Literature

[PTL1] U.S. Pat. No. 7,215,007
[PTL2] Japanese Patent Application Laid-Open No. 2010-10183
[PTL3] Japanese Patent Application Laid-Open No. 2010-199881
[PTL4] Japanese Patent Application Laid-Open No. 2011-165824

SUMMARY OF INVENTION

Technical Problem

It is often the case that a wireless function provided in a recent electronic device supports a plurality of frequency bands. In electronic devices, electromagnetic wave interference causes a problem at a variety of frequencies. Therefore, it is desirable that a wide-range band gap characteristic can be obtained in an EBG structure.

However, the EBG structure described in Patent Literature 1 has a problem in that the band gap range cannot be controlled by any other way than adjusting the structural parameters. The EBG structure described in Patent Literature 1 has an EBG characteristic in a frequency range where the impedance of a series circuit part consisting of the capacitance of a conductor patch and the inductance of a conductor rod behaves as an inductance. The band gap range can be controlled to some extent by adjusting the structural parameters. However, there occurs no change in the basic operating principle when only such parameter adjustment is performed, and therefore, in order to achieve a wide-range band gap characteristic, it is necessary to change the implementation structure into that with an increased size or of losing practicality. For example, while enlarging the conductor patch is effective for increasing the capacitance of the conductor patch, it leads to increase in the structure size.

The objective of the present invention is, in view of the above-described problems, to achieve widening of a band gap in an EBG structure.

Solution to Problem

According to the present invention, there is realized a structure characterized by that it comprises:

a first and second conductor planes which are arranged in different layers and in a manner of facing to each other;

a first transmission line which is formed in a different layer from those of the first and second conductor plane and of the second conductor plane, faces to the second conductor plane, and has its one end being an open end;

a first conductor via which electrically connects the other end of the first transmission line with the first conductor plane;

a second transmission line which is formed in the same layer as that of the first transmission line, runs parallel to the first transmission line, and has its one end being an open end; and a second conductor via which electrically connects the other end of the second transmission line with either of the first and second conductor planes.

According to the present invention, there is also realized a wiring board having the structure just described above.

According to the present invention, there is further realized an electronic device comprising the wiring board just described above.

Advantageous Effects of Invention

According to the present invention, it becomes possible to achieve widening of a band gap in an EBG structure.

BRIEF DESCRIPTION OF DRAWINGS

The above-described objective, further objectives, features and advantages of the present invention will be apparent from exemplary embodiments described below when taken with the following accompanying drawings.

DESCRIPTION OF EMBODIMENTS

Hereinafter, exemplary embodiments of the present invention will be described using the drawings. In the following descriptions, to each constituent element which appears in a plurality of drawings in a common manner, a common sign will be assigned, and its description will be omitted appropriately.

<Operation>

First, general operation of the exemplary embodiments will be described.

Electromagnetic wave noise in question here corresponds to an electromagnetic wave which propagates through a parallel plate line consisting of power and GND planes. Hereinafter, descriptions will be given of how the exemplary embodiments operate to suppress the electromagnetic noise and how they widen the range of a band gap for suppressing the electromagnetic noise.

A structure according to each of the exemplary embodiments is characterized by that the capacitance of a shunt part, which was realized in Patent Literature 1 by a conductor patch and a conductor plane facing to the conductor patch, is realized by a first transmission line functioning as an open stub, and that a second transmission line, which runs in the same layer as and in parallel to the first transmission line and functions as an open stub, changes frequency characteristics of the input impedance of the first transmission line.

When the second transmission line is absent, frequency characteristics of the input impedance of the first transmission line functioning as an open stub is determined by the length of the stub (transmission line length). Because the input impedance of the open stub becomes inductive, periodically in terms of frequency, above each of resonant frequencies at which the input impedance becomes in a series resonance state, it is possible to generate a band gap in a desired frequency range by adjusting the stub length.

In the exemplary embodiments of the present invention, the second transmission line running parallel to the first transmission line, mentioned above, runs so closely to the first transmission line as to be coupled with the first transmission line through either or both of electric and magnetic fields, and accordingly influences frequency characteristics of the input impedance of the open stub constituted by the first transmission line. Specifically, the second transmission line functions to exert an influence on resonant frequencies of the open stub, and thereby to cause each of the frequencies appearing periodically, at which the input impedance of the open stub becomes in a series resonant state, to split into two. It makes it possible to obtain a band gap characteristic whose range is wider than that obtained in the structure not having the second transmission line.

First Exemplary Embodiment

Figure 1:
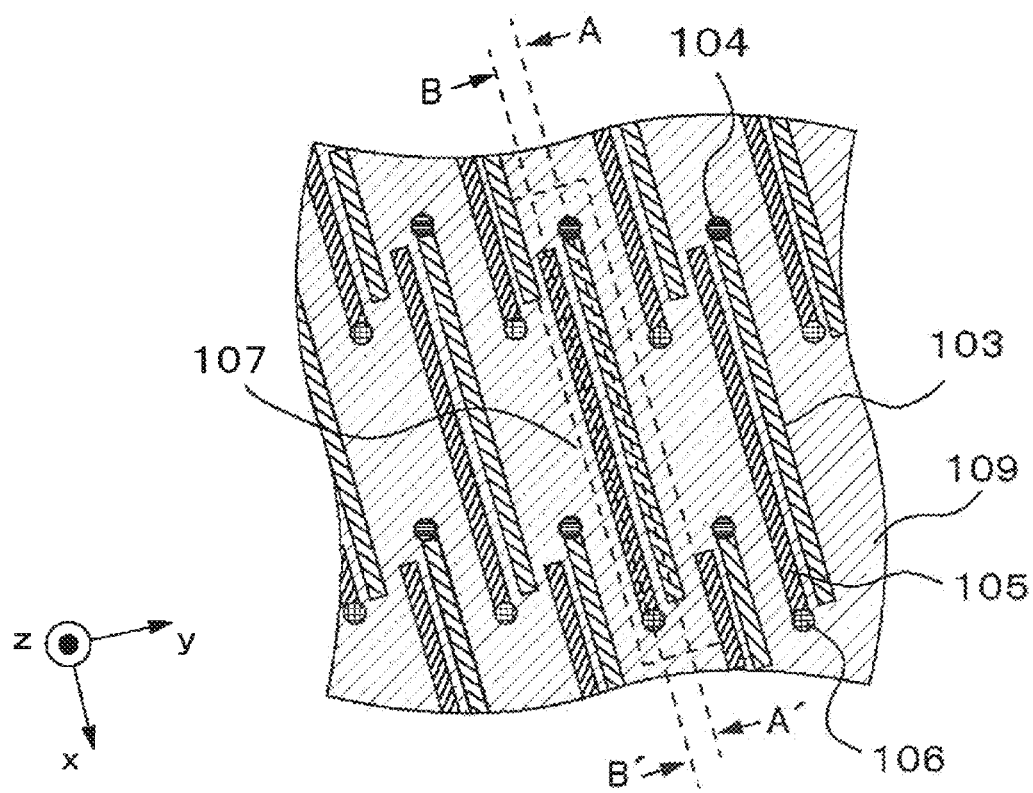
FIG. 1 a plan view showing an example of a structure according to a first exemplary embodiment FIG. 2 a cross-sectional view showing the example of a structure according to the first exemplary embodiment FIG. 3 a cross-sectional view showing the example of a structure according to the first exemplary embodiment FIG. 4 an equivalent circuit diagram of an EBG structure described in a cited document.
Figure 2:
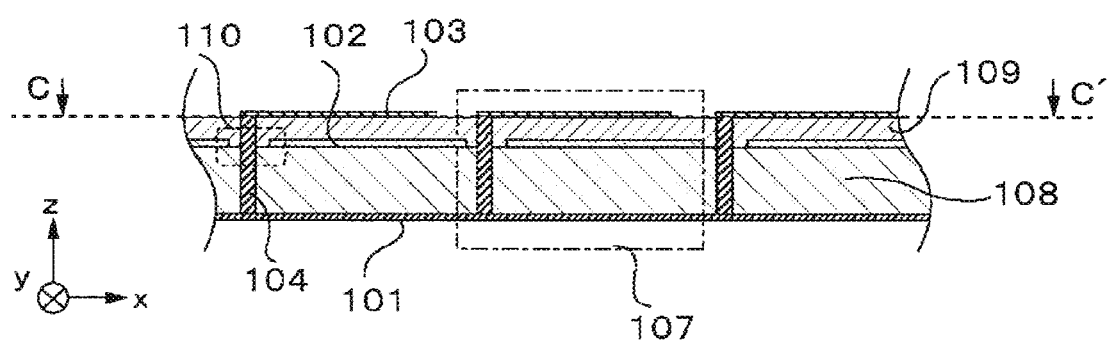
Figure 3:
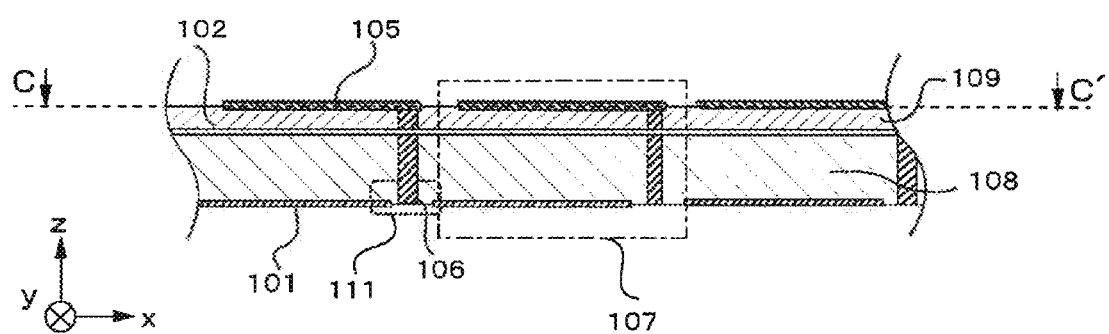
Figure 38:
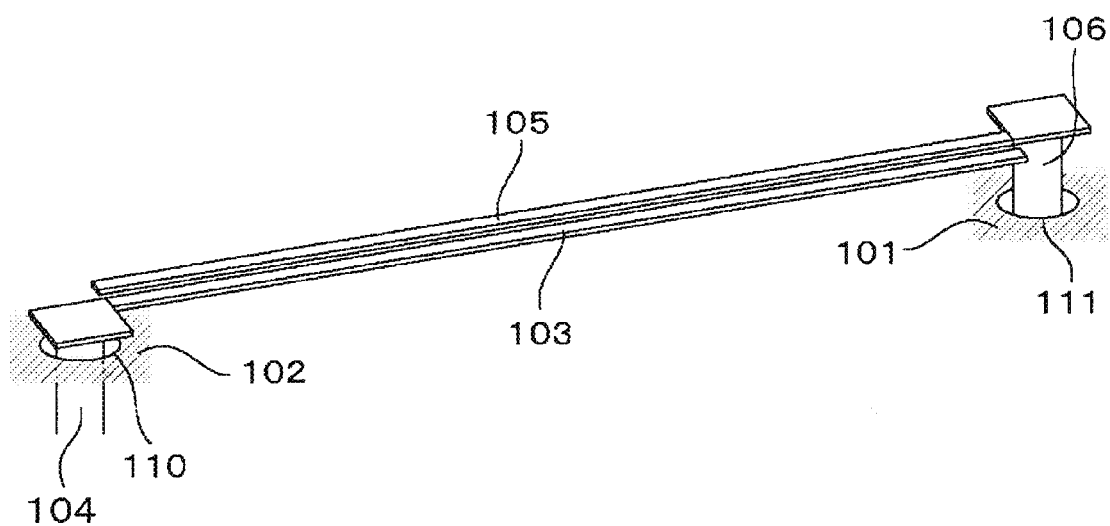

First, a description will be given of a configuration of a first exemplary embodiment of a structure according to the present invention, with reference to FIGS. 1 to 26 and FIGS. 38 and 39. Of the present exemplary embodiment, an example of a perspective view is shown in FIG. 38, an example of a plan view in FIG. 1, and examples of a cross-sectional view in FIGS. 2 and 3. FIG. 2 is a cross-sectional view taken along the line A-A' in FIG. 1, and FIG. 3 is that taken along the line B-B' in FIG. 1. FIG. 1 is a plan view of a plane denoted as C-C' in FIGS. 2 and 3.

As shown in FIGS. 1 to 3, the structure of the present exemplary embodiment comprises a first conductor plane 101, a second conductor plane 102, a first transmission line 103, a first conductor via 104, a second transmission line 105 and a second conductor via 106.

The first conductor plane 101 and the second conductor plane 102 are each arranged in a different layer from that of the other. The first conductor plane 101 and the second conductor plane 102 may be arranged in parallel with each other. The first conductor plane 101 and the second conductor plane 102 face to each other across a first dielectric layer 108 sandwiched between them. Viewing the structure in the z-direction, the first conductor plane 101 and the second conductor plane 102 overlap with each other at least partly.

The first transmission line 103 is formed in a different layer from those of the first conductor plane 101 and of the second conductor plane 102. In the case of the example shown in the diagrams, the first conductor plane 101, the second conductor plane 102 and the first transmission line 103 are arranged to be laid in this order in the z-direction. The first transmission line 103 faces to the second conductor plane 102 across a second dielectric layer 109 sandwiched between them, and has its one end being an open end. Viewing the structure in the z-direction, the second conductor plane 102 and the first transmission line 103 overlap with each other at least partly.

The first conductor via 104 connects the other end (the end on the opposite side to the open end) of the first transmission line 103 with the first conductor plane 101. Here, the other end of the first transmission line 103 is a concept including not only the very end part but also its vicinity. That is, the first conductor via 104 may be connected to the very end part on the side of the other end of the first transmission line 103, or to a part which is in the vicinity of the very end part on the side of the other end but is not the very end part. The first conductor via 104 is in a state of being electrically isolated from the second conductor plane 102.

The second transmission line 105 is formed in the same plane (the same layer) as that of the first transmission line 103, and has its one end being an open end. The first transmission line 103 and the second transmission line 105 run parallel with each other at least partly. For example, at least a part of the first transmission line 103 and that of the second transmission line 105 may extend approximately in parallel with each other.

The second conductor via 106 connects the other end (the end part on the opposite side to the open end) of the second transmission line 105 with the second conductor plane 102. Here, the other end of the second transmission line 105 is a concept including not only the very end part but also its vicinity. That is, the second conductor via 106 may be connected to the very end part on the side of the other end of the second transmission line 105, or to a part which is in the vicinity of the very end part on the side of the other end but is not the very end part. The second conductor via 106 is in a state of being electrically isolated from the first conductor plane 101.

The structure according to the present exemplary embodiment is formed within a printed wiring board, for example, and has an EBG characteristic. A unit cell 107 of the structure includes the first transmission line 103 and the second transmission line 105 running parallel to each other, the first conductor via 104 connected to the first transmission line 103, the second conductor via 106 connected to the second transmission line 105, and a partial region of the first conductor plane 101 and that of the second conductor plane 102 which include their parts overlapping, in the plan view (viewed in the z-direction), with the first transmission line 103, the second transmission line 105, the first conductor via 104 or the second conductor via 106.

Describing in more detail, the structure comprises a first dielectric layer 108 and a second dielectric layer 109 superposed on one side of the first dielectric layer 108 in terms of the thickness direction (the upper side in FIGS. 2 and 3). The first conductor plane 101 is arranged on the other side of the first dielectric layer 108 in terms of the thickness direction (the lower side in FIGS. 2 and 3). The second conductor plane 102 is arranged between the first dielectric layer 108 and the second dielectric layer 109. The first conductor via 104 and the second conductor via 106 extend in the thickness direction, where they are arranged to extend from one side of the second dielectric layer 109 (the upper side in FIGS. 2 and 3, or the side of its surface not facing to the first dielectric layer 108) to the above-defined other side of the first dielectric layer 108 (the lower side in FIGS. 2 and 3, or the side of its surface not facing to the second dielectric layer 109). On the above-defined one side, in terms of the thickness direction, of the second dielectric layer 109 (the upper side in FIGS. 2 and 3, or the side of its surface not facing to the first dielectric layer 108), the first transmission line 103 and the second transmission line 105 are arranged. In the present exemplary embodiment, the first conductor via 104 is arranged to connect the above-defined other end of the first transmission line 103 with the first conductor plane 101, and the second conductor via 106 is arranged to connect the above-defined other end of the second transmission line 105 with the second conductor plane 102.

The first transmission line 103 is a transmission line which is arranged in a plane facing to the second conductor plane 102 and uses the second conductor plane 102 as its return path. The first transmission line 103 is constructed to have its one end (the right end part in FIG. 2) being an open end and accordingly to function as an open stub. The other end of the transmission line 103 (the left end part in FIG. 2) and the first conductor plane 101 are electrically connected with each other through the first conductor via 104 extended in the thickness direction. In the second conductor plane 102, a first clearance 110 is arranged at a position corresponding to the first conductor via 104, and the first clearance 110 thus makes the first conductor via 104 and the second conductor plane 102 be in a state of being electrically isolated from each other and accordingly being not in electrically contact with each other.

The second transmission line 105 is a transmission line which uses the second conductor plane 102 as its return path and is formed in the same plane as that of the first transmission line 103. The second transmission line 105 is a transmission line which is arranged in the plane facing to the second conductor plane 102 and uses the second conductor plane 102 as its return path. The second transmission line 105 is formed to have its one end (the left end part in FIG. 3) being an open end. Its other end (the right end part in FIG. 3) is electrically connected with the first conductor plane 101 through the second conductor via 106 extended in the thickness direction. The second transmission line 105 behaves as a resonator with its one end shorted and the other end opened. In the first conductor plane 101, a second clearance 111 is arranged at a position corresponding to the second conductor via 106, and the second clearance 111 thus makes the second conductor via 106 and the first conductor plane 101 be in a state of being electrically isolated from each other and accordingly being not in electrically contact with each other. The unit cell 107 is thus constituted by the first transmission line 103, the second transmission line 105, the first conductor via 104 and the second conductor via 106.

Figure 4:
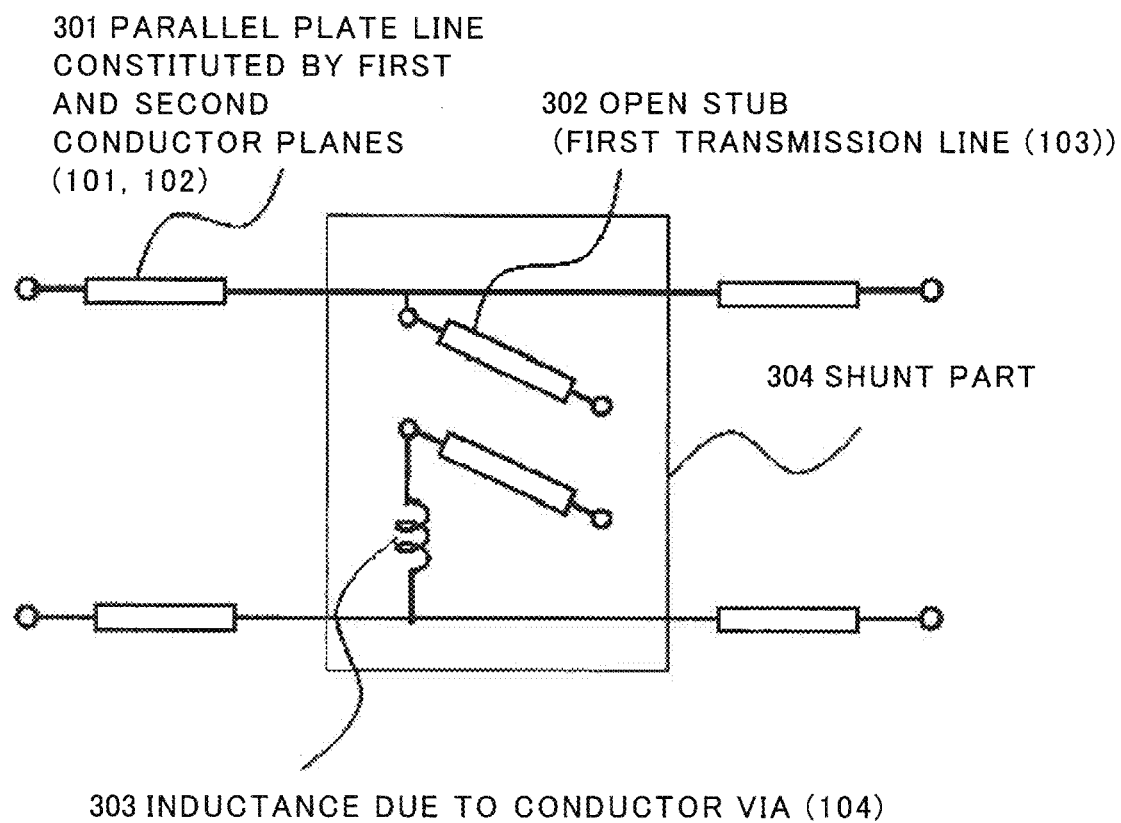

Next, a basic operating principle of the above-described structure will be described. FIG. 4 is an equivalent circuit diagram of an EBG structure described in Patent Literature 2. In such a waveguide structure as expressed by the equivalent circuit shown in FIG. 4, a frequency region in which a shunt part 304 shows an inductive behavior corresponds to a band gap, roughly said. The present exemplary embodiment has a configuration where a resonator constituted by the second transmission line 105 is added to the structure described in Patent Literature 2. By the resonator being coupled with the open stub of FIG. 4 (corresponding to the first transmission line 103) through an electromagnetic field, a frequency response of the input impedance of the open stub is changed, and accordingly, widening of the band gap becomes possible. In order to enhance electromagnetic coupling between the first transmission line 103 and the newly added resonator (the second transmission line 105), it is necessary that the distance between the first transmission line 103 and the second transmission line 105 running parallel to the first transmission line 103 is small. Specifically, it is preferable that at least either of the following conditions is satisfied: (1) no other structure (for example, a signal via, a signal wire or the like) is present between the first transmission line 103 and the second transmission line 105, (2) assuming that h represents the interval between the second conductor plane 102 and the plane in which the first transmission line 103 and the second transmission line 105 are arranged, the interval (the shortest distance) between the first transmission lines 103 and the second transmission lines 105, running parallel to each other, is equal to or smaller than 2h. The condition (2) may be described in other words as that the present configuration has a part where the interval between the first transmission line 103 and the second transmission line 105 is equal to or smaller than 2h. In that case, the longer the part where the two transmission lines run parallel with each other is, the larger the electromagnetic coupling between the first transmission line 103 and the resonator constituted by the second transmission line 105 becomes, and accordingly, the more remarkably the effect of the present invention can be achieved. Therefore, assuming that the length of the second transmission line is represented by $L_2$, it is preferable to have the parallel running part of a length equal to or larger than $L_2/4$, or more preferably, equal to or larger than $L_2/2$. It is further preferable to satisfy a condition that the interval (the shortest distance) between the first transmission line 103 and the second transmission line 105 is equal to or smaller than 1.5 h.

Further, it is desirable that, as in FIG. 1, the end part equivalent to the above-defined other end of the first transmission line 103, at which the first conductor via 104 is connected to the first transmission line 103, is located on the same side as the open end of the second transmission line 105. That is, assuming that the direction from the open end of the first transmission line 103 toward its other end is defined as a first direction, and that the direction from the open end of the second transmission line 105 toward its other end as a second direction, it is desirable that the first and second directions are oriented opposite to each other (in approximately 180 degree opposite directions) in the part where the first transmission line 103 and the second transmission line 105 run parallel to each other. This condition also is desired for enhancing electromagnetic coupling between the first transmission line 103 and the newly added resonator (the second transmission line 105). At the same time, the newly added resonator (the second transmission line 105) is designed to have a resonant frequency close to a resonant frequency due to the length of the first transmission line 103.

Specifically, for example, a case of the second transmission line 105 having a length of about the same as or about ⅓ of the length of the first transmission line 103 corresponds to such design. For example, the length of the second transmission line 105 may be set to be about 1/(2n−1) of the length of the first transmission line 103 (n is a natural number). In that case, the length of the second transmission line 105 does not necessarily need to be exactly the length just described above. For example, assuming that the length of the first transmission line 103 is represented by L, it is enough if the length of the second transmission line 105 is contained within such a range of values as from (L−L/8) to (L+L/8) or from (L/3−L/8) to (L/3+L/8).

In the above description, the length of the second transmission line 105 has been prescribed with reference to the length of the first transmission line 103, but when a structure for adding a capacitor or an inductance is attached to the first transmission line 103 or when the effective dielectric constant is different between the second transmission line 105 and the first transmission line 103, it is impossible to prescribe the length of the second transmission line 105 simply using the length of the first transmission line 103 as the reference. In such cases, it becomes necessary to prescribe the length of the second transmission line 105 taking into consideration a resonant frequency at which the first transmission line 103 becomes in a series resonance state, or to design a resonant frequency of the second transmission line 105 with a capacitor or an inductance added to it.

Hereinafter, a description will be given of how the newly added resonator changes a frequency response of the input impedance of the original open stub (the first transmission line 103).

The newly added resonator is coupled with the open stub constituted by the first transmission line 103 through either or both of a magnetic field and an electric field. In the vicinity of a frequency at which a band gap starts, the open stub constituted by the first transmission line 103 can be approximately expressed by an equivalent circuit model of a series resonator. Therefore, the structure of the present exemplary embodiment can be expressed, in the vicinity of the start frequency of a band gap, by an equivalent circuit model obtained by modifying that shown in FIG. 4 by replacing the input impedance $Z_{in}$ of the open stub with the input impedance of an equivalent circuit shown in FIG. 5.

Figure 5:
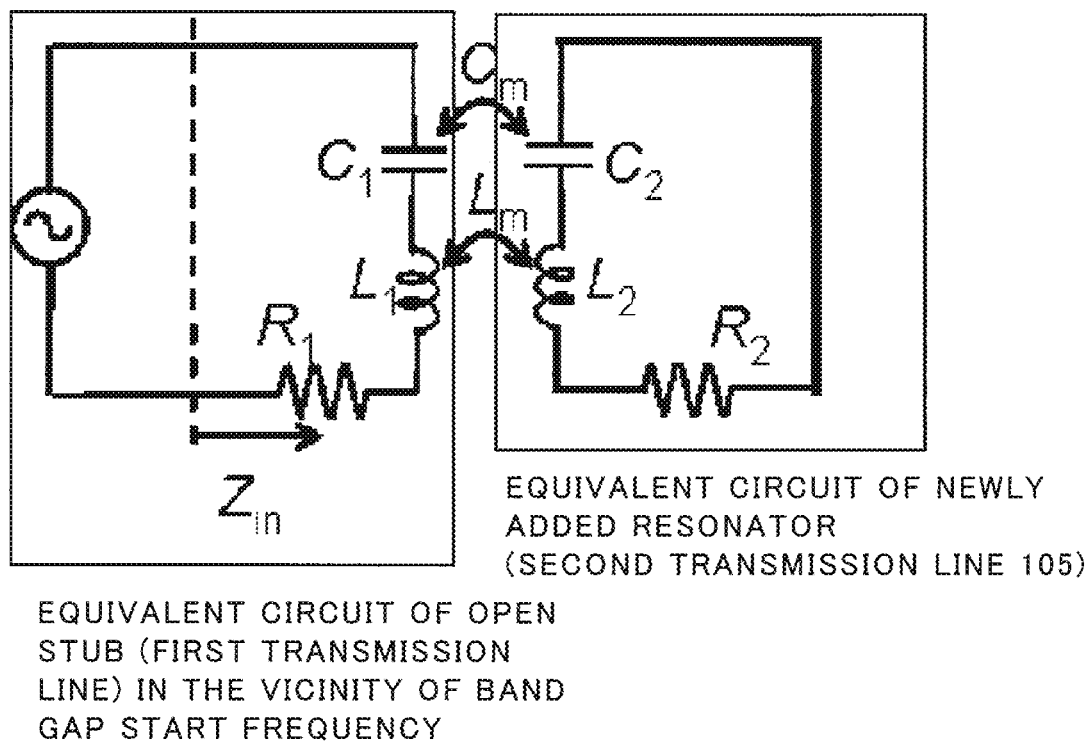
FIG. 5 a diagram for explaining a principle of the structure according to the first exemplary embodiment FIG. 6 a diagram for explaining an effect of the structure according to the first exemplary embodiment FIG. 7 a diagram for explaining the effect of the structure according to the first exemplary embodiment FIG. 8 a diagram for explaining the effect of the structure according to the first exemplary embodiment FIG. 9 a diagram for explaining the effect of the structure according to the first exemplary embodiment FIG. 10 a diagram for explaining the effect of the structure according to the first exemplary embodiment FIG. 11 a diagram for explaining the effect of the structure according to the first exemplary embodiment FIG. 12 a diagram for explaining the effect of the structure according to the first exemplary embodiment FIG. 13 a cross-sectional view showing an example of a unit cell of a structure according to the first exemplary embodiment FIG. 14 a cross-sectional view showing the example of a unit cell of the first structure according to the exemplary embodiment FIG. 15 a cross-sectional view showing an example of a unit cell of a structure according to the first exemplary embodiment FIG. 16 a cross-sectional view showing the example of a unit cell of the structure according to the first exemplary embodiment FIG. 17 a cross-sectional view showing an example of a unit cell of a structure according to the first exemplary embodiment FIG. 18 a plan view showing an example of a unit cell of a structure according to the first exemplary embodiment FIG. 19 a plan view showing an example of a unit cell of a structure according to the first exemplary embodiment FIG. 20 a plan view showing an example of a unit cell of a structure according to the first exemplary embodiment FIG. 21 a plan view showing an example of a unit cell of a structure according to the first exemplary embodiment FIG. 22 a plan view showing an example of a unit cell of a structure according to the first exemplary embodiment FIG. 23 a plan view showing an example of a unit cell of a structure according to the first exemplary embodiment FIG. 24 a plan view showing an example of a unit cell of a structure according to the first exemplary embodiment FIG. 25 a plan view showing an example of a unit cell of a structure according to the first exemplary embodiment FIG. 26 a plan view showing an example of a unit cell of a structure according to the first exemplary embodiment FIG. 27 a cross-sectional view showing an example of a unit cell of a structure according to a second exemplary embodiment FIG. 28 a cross-sectional view showing the example of a unit cell of the structure according to the second exemplary embodiment FIG. 29 a cross-sectional view showing an example of a unit cell of a structure according to the second exemplary embodiment FIG. 30 a cross-sectional view showing the example of a unit cell of the structure according to the second exemplary embodiment FIG. 31 a cross-sectional view showing an example of a unit cell of a structure according to a third exemplary embodiment FIG. 32 a cross-sectional view showing the example of a unit cell of the structure according to the third exemplary embodiment FIG. 33 a plan view showing an example of a structure according to the third exemplary embodiment FIG. 34 a cross-sectional view showing an example of a unit cell of a structure according to a fourth exemplary embodiment FIG. 35 a cross-sectional view showing the example of a unit cell of the structure according to the fourth exemplary embodiment FIG. 36 a cross-sectional view showing an example of a unit cell of a structure according to the fourth exemplary embodiment FIG. 37 a cross-sectional view showing the example of a unit cell of the structure according to the fourth exemplary embodiment FIG. 38 a perspective view showing an example of a unit cell of a structure according to the first exemplary embodiment FIG. 39 a perspective view showing an example of a unit cell of a structure according to the first exemplary embodiment FIG. 40 a perspective view showing an example of a unit cell of a structure according to the second exemplary embodiment FIG. 41 a perspective view showing an example of a unit cell of a structure according to the second exemplary embodiment FIG. 42 a perspective view showing an example of a unit cell of a structure according to the third exemplary embodiment FIG. 43 a perspective view showing an example of a unit cell of a structure according to the fourth exemplary embodiment FIG. 44 a perspective view showing an example of a unit cell of a structure according to the fourth exemplary embodiment

The equivalent circuit in FIG. 5 has a configuration where the newly added resonator constituted by the second transmission line 105 is coupled, through a mutual inductance $L_m$ and a mutual capacitance $C_m$, to an equivalent circuit model expressing the open stub constituted by the first transmission line 103. An AC source in FIG. 5 is assumed, in the present exemplary embodiment, to be electromagnetic noise which excites the open stub constituted by the first transmission line 103, and resistors $R_1$ and $R_2$ are equivalent circuit elements into which losses due to conductor loss and dielectric loss are modeled.

Figure 7:
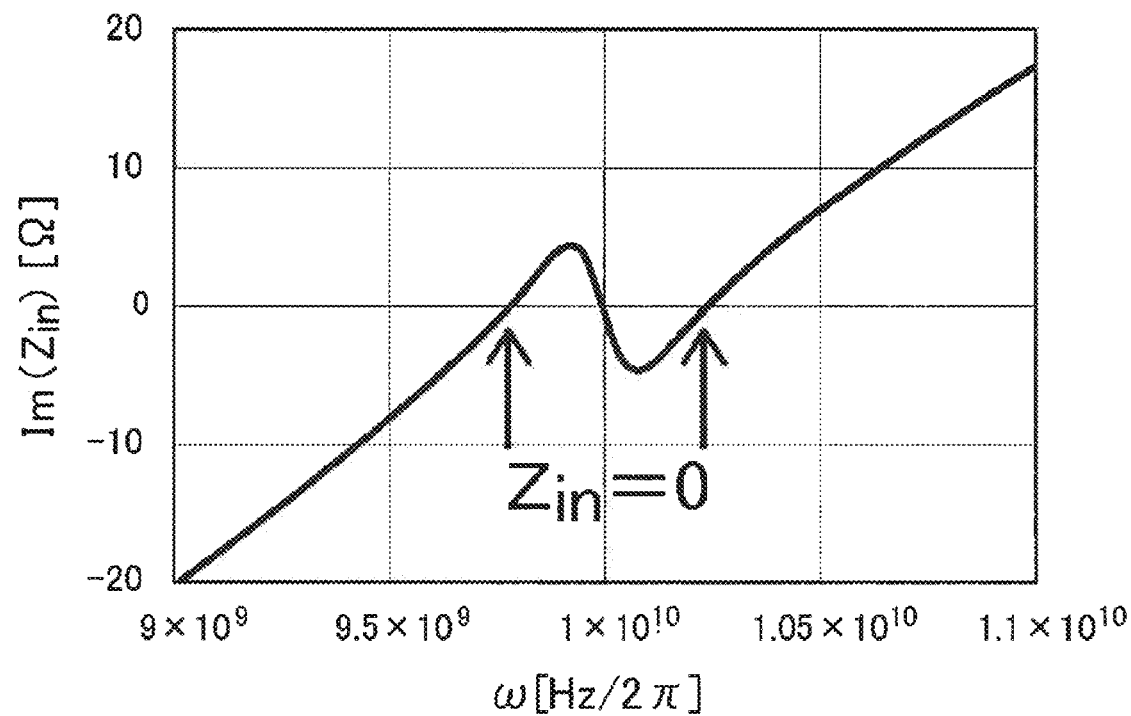

FIG. 7 is a graph of the imaginary part of $Z_{in}$, in the equivalent circuit of FIG. 5, when assuming $L_1=L_2$, $C_1=C_2$, $R_1=R_2$, $L_m=0.5$ nH and $C_m=0$ F and taking into account only coupling through a magnetic field. In that case, the two resonators (one constituted by the first transmission line 103, and the other by the second transmission line 105) have the same resonant frequency.

Figure 6:
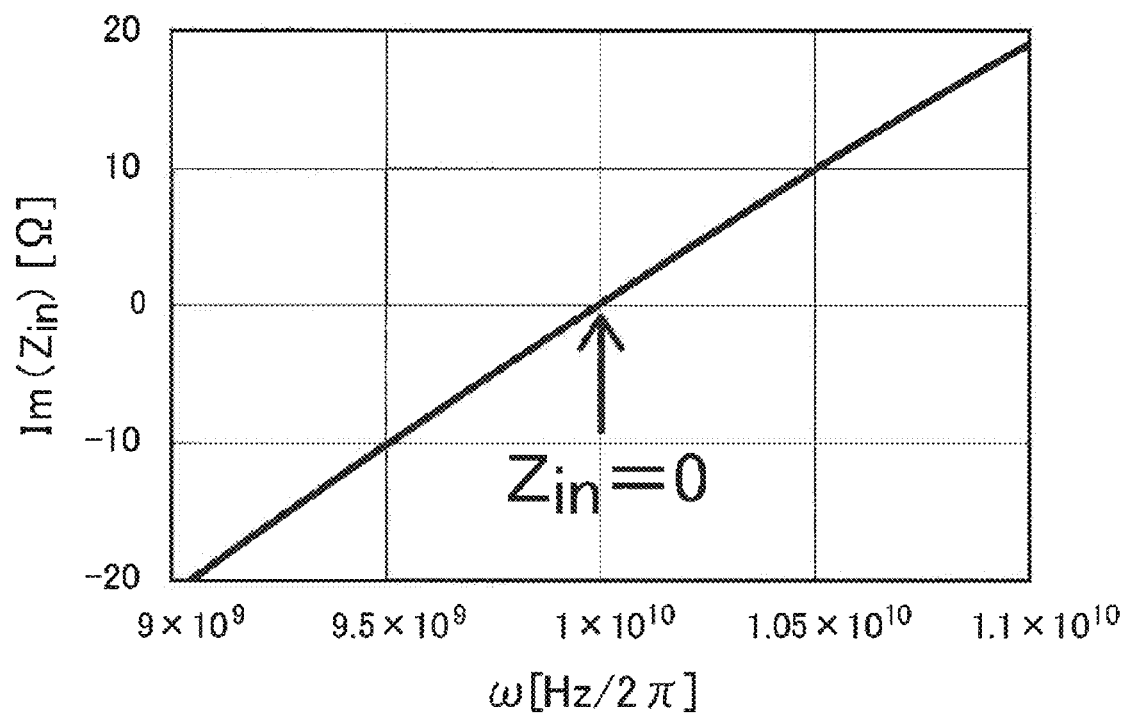

FIG. 6 is a graph of the imaginary part of $Z_{in}$ when assuming the value of Lm to be 0, among the set of parameter values used for calculating FIG. 7, thus eliminating coupling between the two resonators, and the graph accordingly corresponds to that of the imaginary part of the input impedance of the open stub in the structure described in Patent Literature 2. While there is only a single frequency at which the imaginary part of $Z_{in}$ becomes 0 in the case with no coupling (FIG. 6), it is seen that the frequency is split into two in the case with coupling (FIG. 7). A rough band gap frequency in the structure of the present exemplary embodiment can be estimated from a frequency characteristic of a sum of $Z_{in}$ and the impedance due to the vias, $Z_{in}+j\omega L_{via}$.

Figure 8:
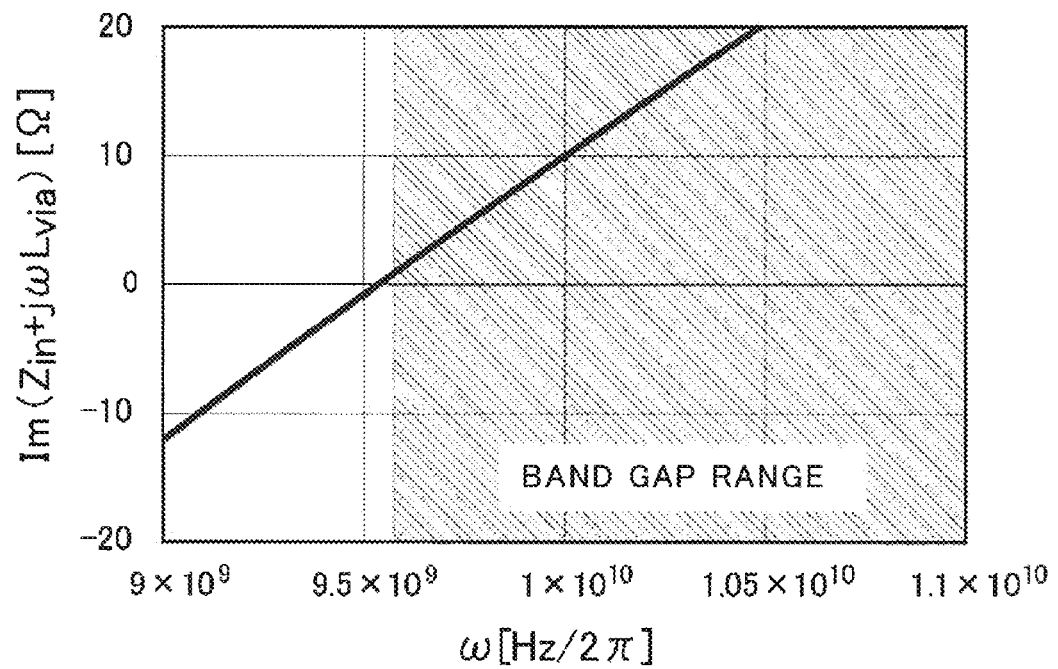
Figure 9:
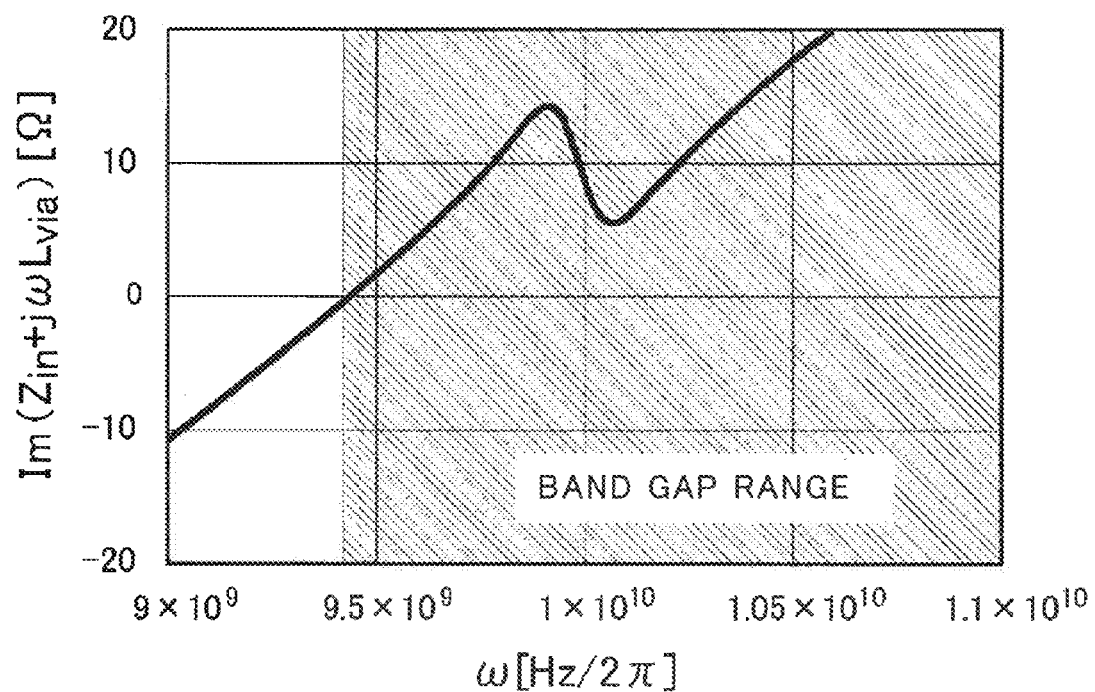

FIGS. 8 and 9 show frequency characteristics of the imaginary part of $Z_{in}+j\omega L_{via}$ when assuming $L_{via}=1$ nH. FIGS. 8 and 9 are ones obtained by adding $j\omega L_{via}$ to the input impedance $Z_{in}$ shown in FIG. 6 and that in FIG. 7, respectively. As already described above, a frequency range over which the impedance of the shunt part $Z_{in}+j\omega L_{via}$ is inductive corresponds to a band gap frequency range. It is realized from FIGS. 8 and 9 that, in FIG. 9, the lower end frequency of the band gap is lowered by the effect of the existence of the newly added resonator, and as a result, the band gap range is widened.

Figure 10:
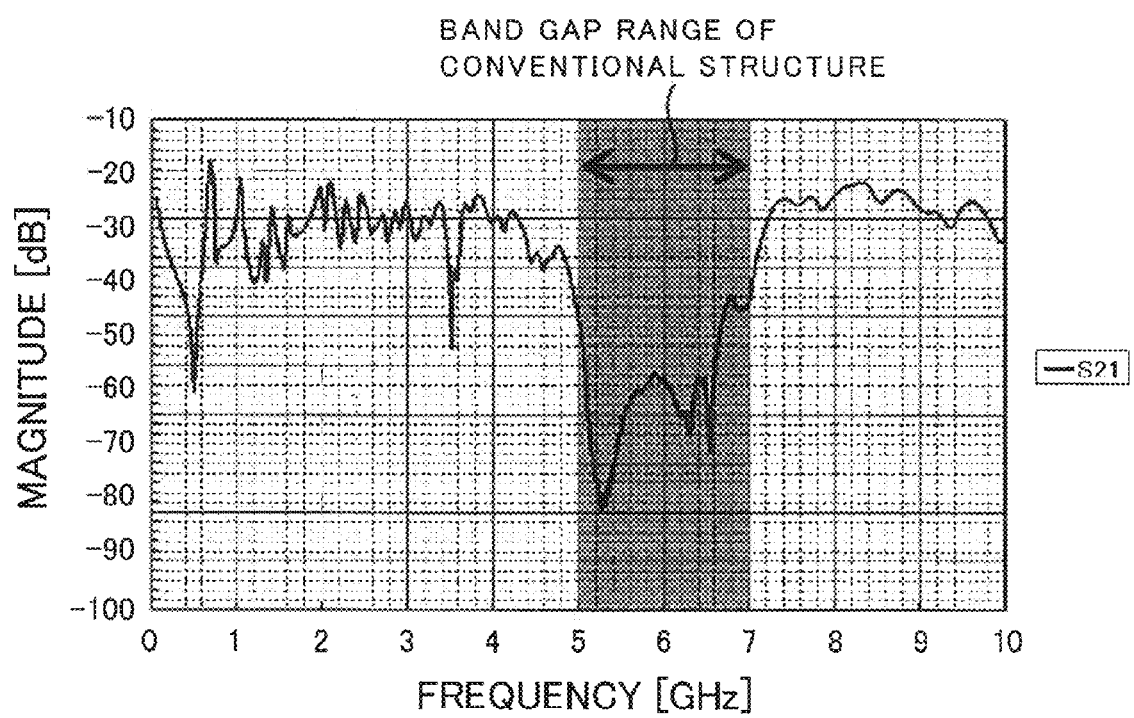
Figure 11:
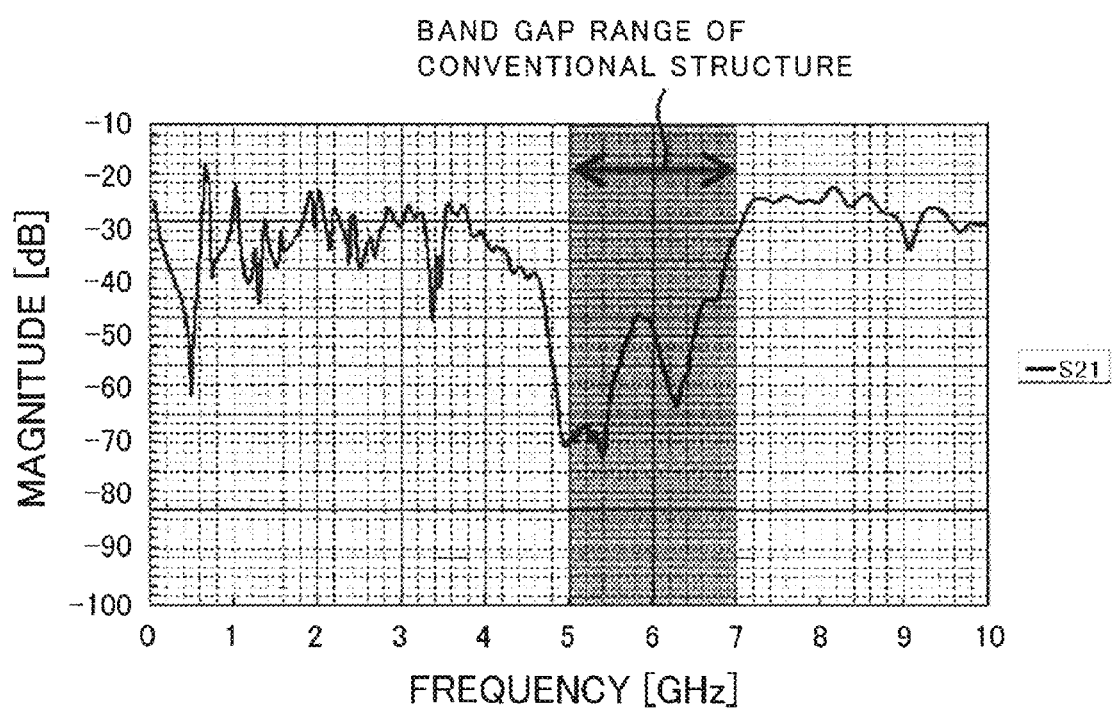
Figure 12:
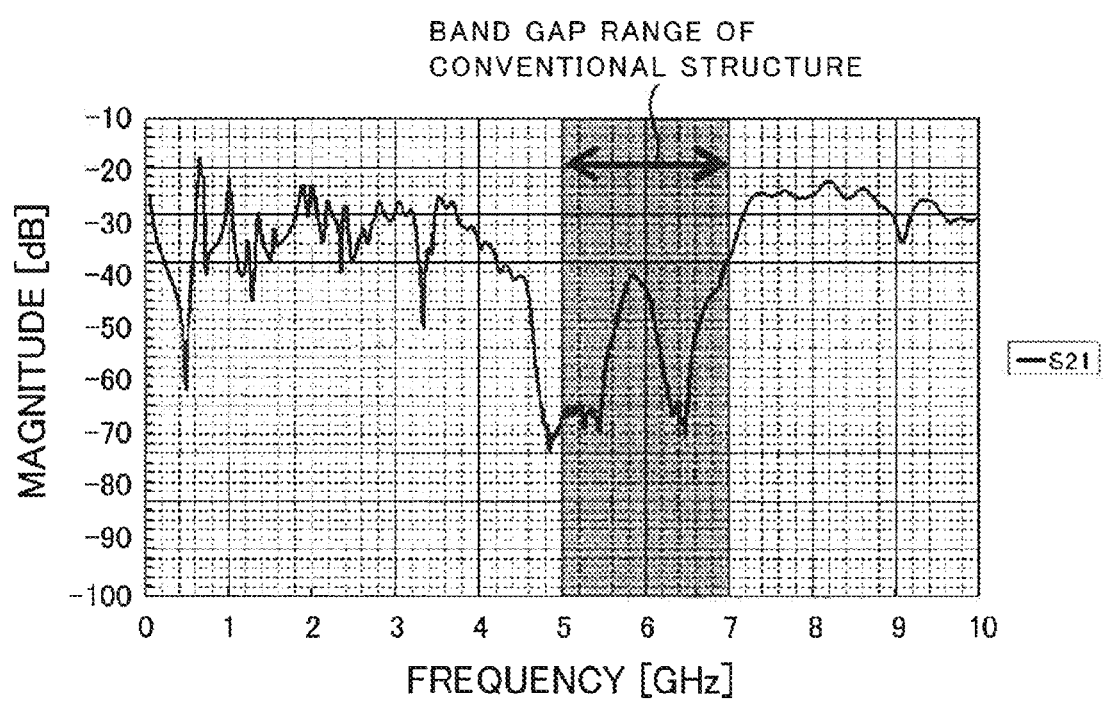

FIGS. 10 to 12 show actual measurement results on evaluation boards into which the structure of the present exemplary embodiment is implemented, where the first conductor plane 101 and the second conductor plane 102 were excited. These measurement results represent propagation characteristics (absolute values of S21) of parallel plate lines constituted by the first conductor plane 101 and the second conductor plane 102 in the respective evaluation boards. FIG. 10 is a measurement result of a propagation characteristic of a structure without the second transmission line 105 nor the second conductor via 106, which is considered here as the reference. FIGS. 11 and 12 show measurement results of propagation characteristics of the respective evaluation boards into which the structure of the present exemplary embodiment is truly implemented. FIG. 11 shows a measurement result on the structure in which the distance between the first transmission line 103 and the second transmission line 105 is 130 μm, and FIG. 12 shows that on the structure in which the distance is 100 μm. Other structural parameters of the evaluation boards are set as: the thickness of the first dielectric layer 108 at 500 μm, the thickness of the second dielectric layer 109 at 100 μm, the line width of the first transmission line 103 at 130 μm, the line width of the second transmission line 105 at 130 μm, the line length of the first transmission line 103 at 6 mm, and the line length of the second transmission line 105 at 6 mm, and the board material is FR4. In every one of FIGS. 10 to 12, a band gap range observed in the measurement result used as the reference (FIG. 10) is shown by a shaded area. As realized from these figures, the band gap range is widened in FIGS. 11 and 12, compared to FIG. 10. Comparing FIGS. 11 and 12 with each other, it is realized that the band gap start frequency is lowered more in FIG. 12 where the distance between the transmission lines is smaller, and accordingly, more enhanced coupling between the transmission lines occurs. From the above results, it is realized that the present exemplary embodiment operates correctly in actual boards.

Figure 13:
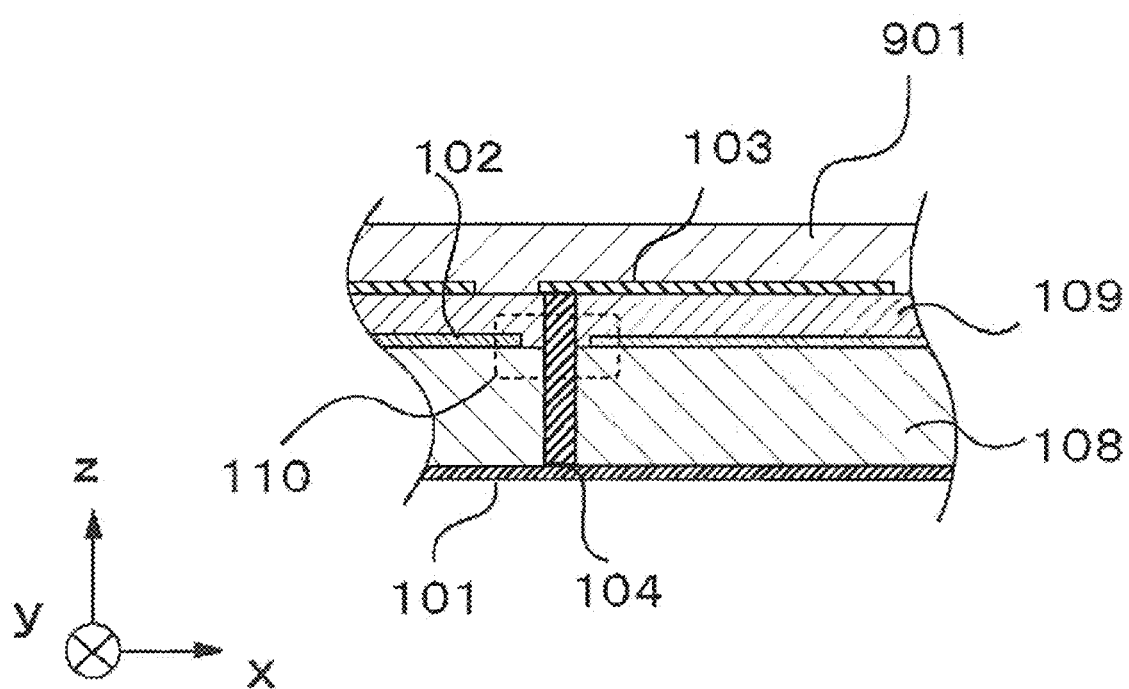
Figure 14:
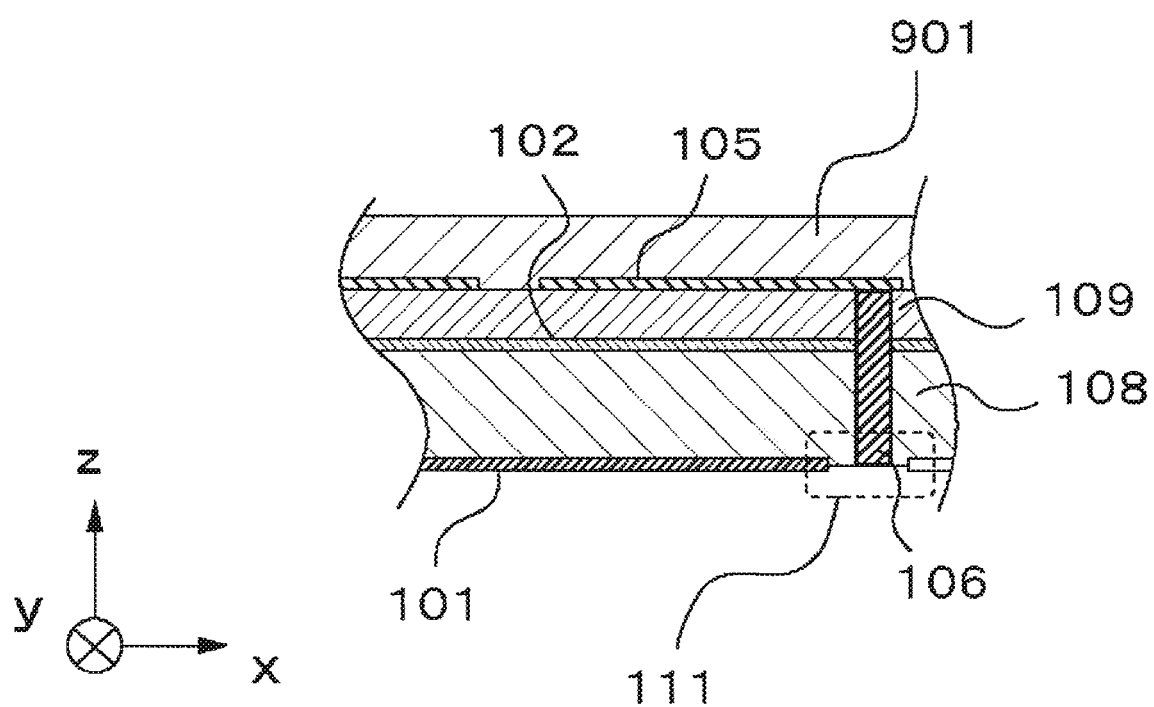

The cases shown in the above descriptions of the present exemplary embodiment are those where no structure is present over the plane in which the first transmission line 103 and the second transmission line 105 are arranged, as shown in FIGS. 2 and 3. However, the present exemplary embodiment may have some structure over the plane in which the first transmission line 103 and the second transmission line 105 are arranged. For example, as shown in FIGS. 13 and 14, a dielectric layer (a third dielectric layer 901) may be provided over the plane in which the first transmission line 103 and the second transmission line 105 are arranged. By thus providing the third dielectric layer 901, it is possible to increase the effective relative dielectric constant of the first transmission line 103 and that of the second transmission line 105. Frequency dependence of the input impedance of the open stub is affected by the wavelength of an electromagnetic wave propagating in the open stub. Accordingly, in the present structure provided with the third dielectric layer 901, a band gap can be provided in the same range using a smaller transmission line length than in the structure without the third dielectric layer 901. As a result, the present structure enables size reduction.

Figure 15:
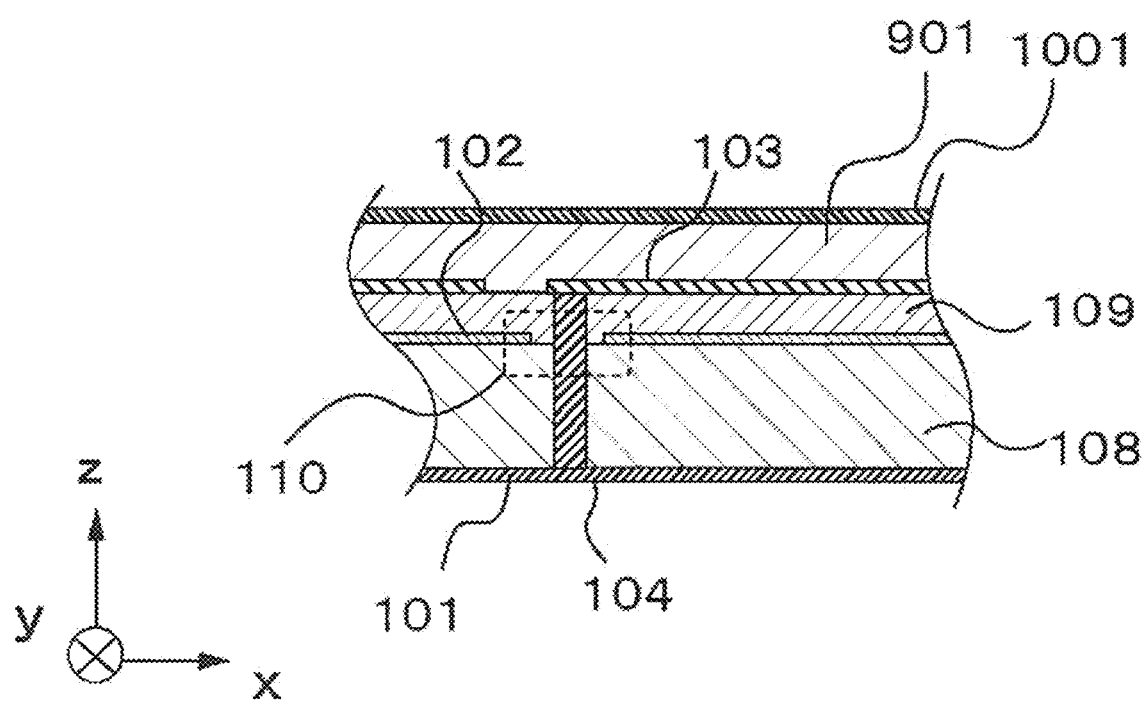
Figure 16:
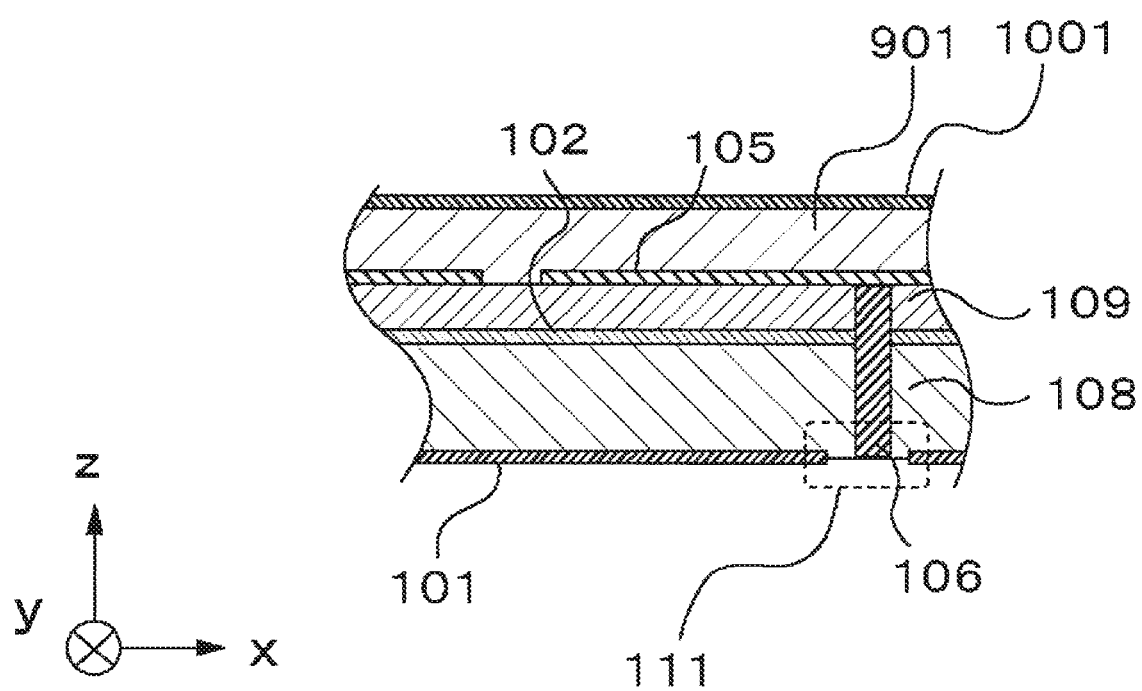
Figure 17:
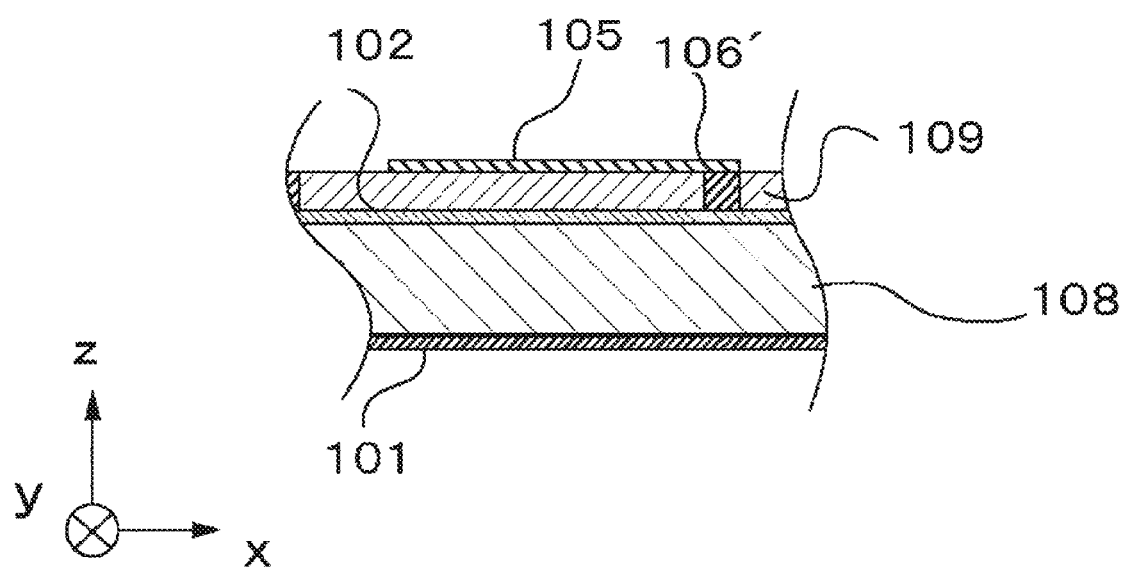

Aiming at size reduction of the structure of the present exemplary embodiment, it is preferable to use a dielectric material having a high dielectric constant as the third dielectric layer 901. However, when size reduction of the structure is not aimed at, any dielectric material may be used. That is, when some other layers are further laminated over the structure, any dielectric material may be used. Further, for example, as shown in FIGS. 15 and 16, a third conductor plane 1001 may be disposed on the third dielectric layer 901. In that case, the first transmission line 103 and the second transmission line 105 are shielded by the third conductor plane 1001, and it accordingly becomes possible to suppress unnecessary electromagnetic radiation from the first transmission line 103 or the second transmission line 105. It is obvious that other dielectric or conductor layers may be further laminated over the top or under the bottom of the structure.

Figure 39:
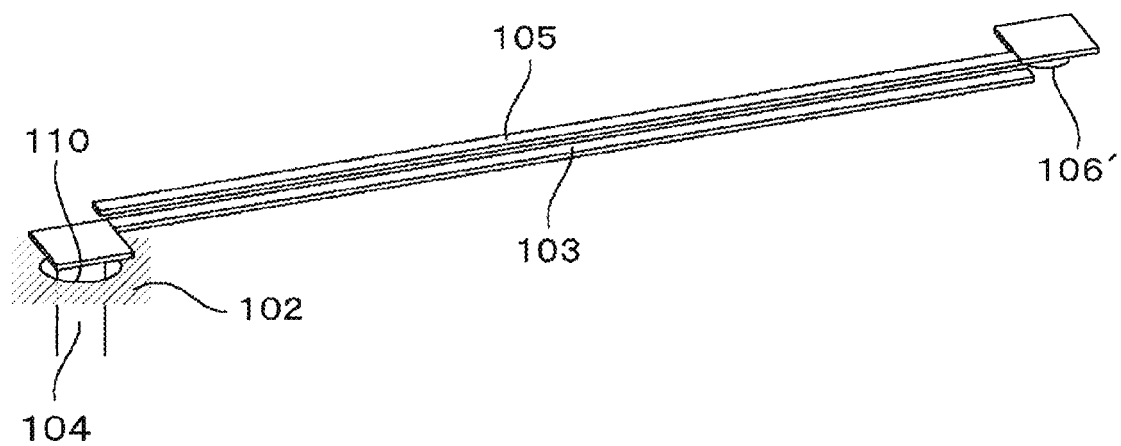

While, in the above descriptions of the present exemplary embodiment, the cases of using through vias as the first conductor via 104 and the second conductor via 106 has been shown, as in FIGS. 2 and 3, non-through vias may also be used. In that case, a cross-sectional view of a unit cell corresponding to that in FIG. 3 may be illustrated as that shown in FIG. 17. An example of a perspective view of the present structure of the present exemplary embodiment is shown in FIG. 39. In the present case, it becomes unnecessary to provide the clearance 111 in the first conductor plane 101, and accordingly, suppression of unnecessary electromagnetic radiation from the clearance becomes possible.

Any kind of arrangement and shape of the first transmission line 103 has no influence on the essential effect of the present exemplary embodiment if at least the first transmission line 103 has its one end being an open end and the other end being connected to the first conductor via 104. The cases shown in the above descriptions of the present exemplary embodiment are those where the first transmission line 103 and the second transmission line 105 are arranged in parallel to the x-axis, as shown in FIG. 1, so as not to interfere with the clearances or the like around them. However, they may be arranged to have certain angles with respect to the x- and y-axes, or may be arranged in a completely random manner.

Figure 18:
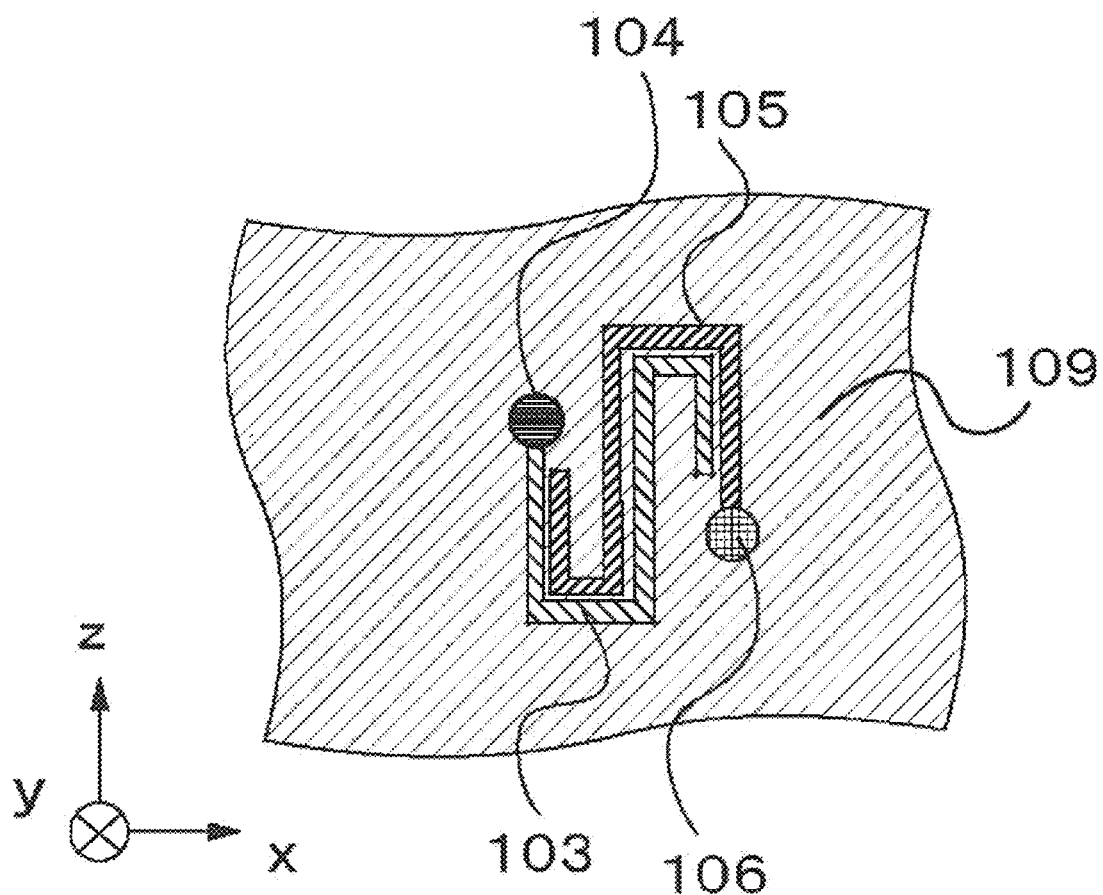
Figure 19:
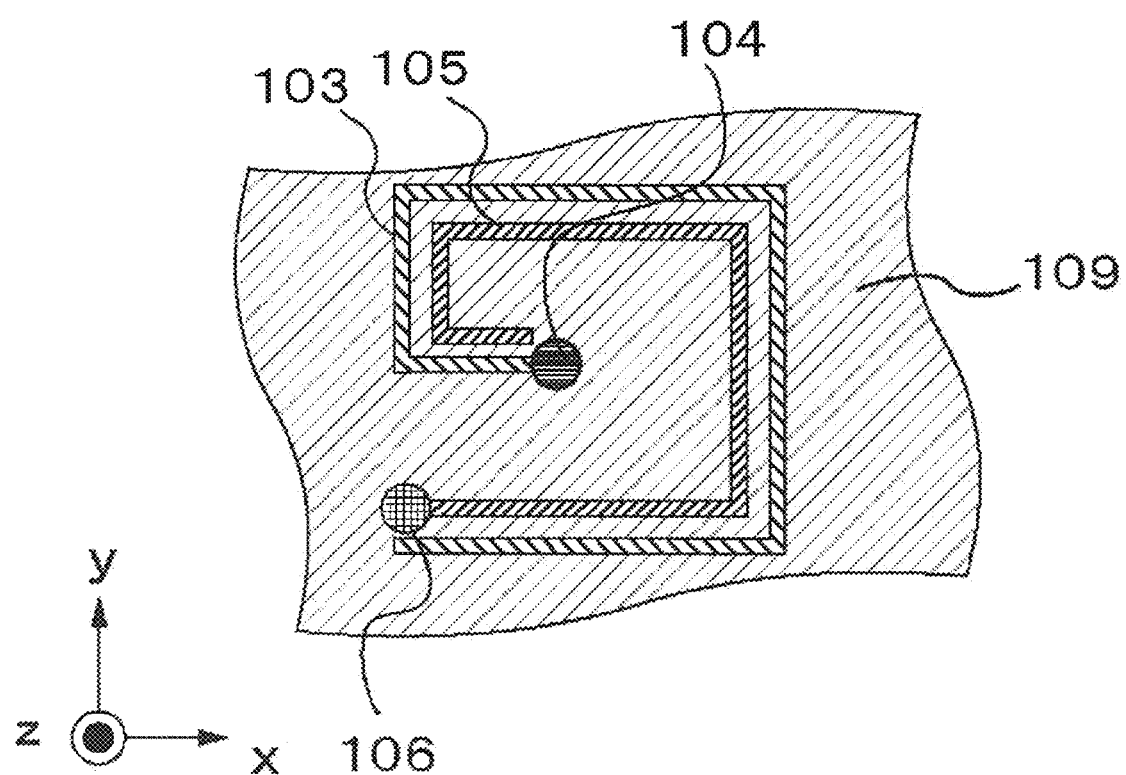

While the cases shown in the above descriptions of the present exemplary embodiment are those where the first transmission line 103 and the second transmission line 105 each have a linear shape, as shown in FIG. 1, they may be formed to have, for example, a meander shape such as shown in FIG. 18 or a spiral shape such as shown in FIG. 19. In that case, it becomes possible to secure the transmission line lengths even with a small implementation area. The two transmission lines may also have a shape routed in a completely unordered manner. In that case, the first transmission line 103 and the second transmission line 105 may be arranged in a manner to run aside from other structures (for example, transmission lines in another unit cell or the like).

The above descriptions of the present exemplary embodiment have been given of the cases where the transmission line length of the second transmission line 105 is relatively close to that of the first transmission line 103. In such cases, the n-th resonant frequency of the first transmission line 103 coincides with that of the second transmission line 105 (n is a natural number), and accordingly, the effect of band gap widening can be achieved with respect to all of the band gaps including the first, second and following band gaps. From the viewpoint of achieving the effect of the present exemplary embodiment, it is not necessarily required that the length of the first transmission line 103 is relatively close to that of the second transmission line 105. The configuration may also be one where the transmission line length of the second transmission line 105 is smaller or larger than that of the first transmission line 103.

Figure 20:
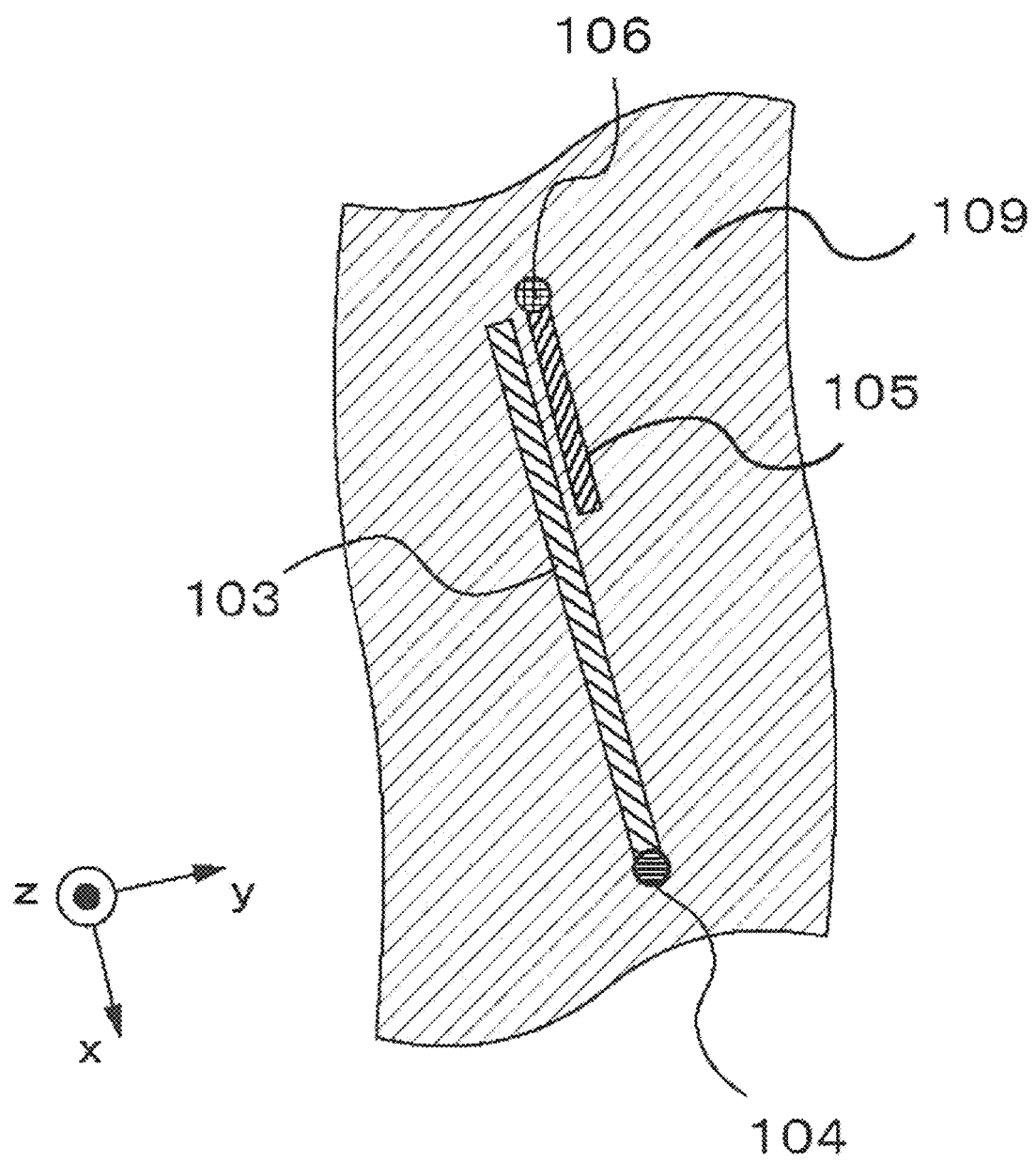

FIG. 20 is a diagram showing an example of a unit cell where the transmission line length is smaller for the second transmission line 105 than for the first transmission line 103. In that case, by setting the transmission line length of the second transmission line 105 to be about $1/(2n-1)$ of the length of the first transmission line 103, which is equivalent to a length corresponding to the n-th resonance of the first transmission line 103 (n is a natural number), the widening effect can be achieved with respect to the n-th and following band gaps. When n is set at 2 or a larger value, the length of the second transmission line 105 can be made to be smaller than that equal to about the length of the first transmission line 103, which corresponds to the case of n=1, and accordingly, it becomes possible to achieve the effect of the present exemplary embodiment with a smaller implementation area. In the above descriptions, the length of the second transmission line 105 is prescribed with reference to the length of the first transmission line 103, but when a structure for adding a capacitor or an inductance is attached to the first transmission line 103 or when the effective dielectric constant is different between the second transmission line 105 and the first transmission line 103, it is impossible to prescribe the length of the second transmission line 105 simply using the length of the first transmission line 103 as the reference. In such cases, it becomes necessary to prescribe the length of the second transmission line 105 taking into account a resonant frequency at which the first transmission line 103 becomes in a series resonance state, or to design a resonant frequency of the second transmission line 105 with a capacitor or an inductance added to it.

Further, a plurality of second transmission lines 105 may be arranged to run parallel to the single first transmission line 103. For example, a configuration which may be considered is one in which, in addition to a second transmission line 105A running parallel to the first transmission line 103, another second transmission line 105B is arranged in a manner to run parallel to the first transmission line 103 or the second transmission line 105A.

Figure 21:
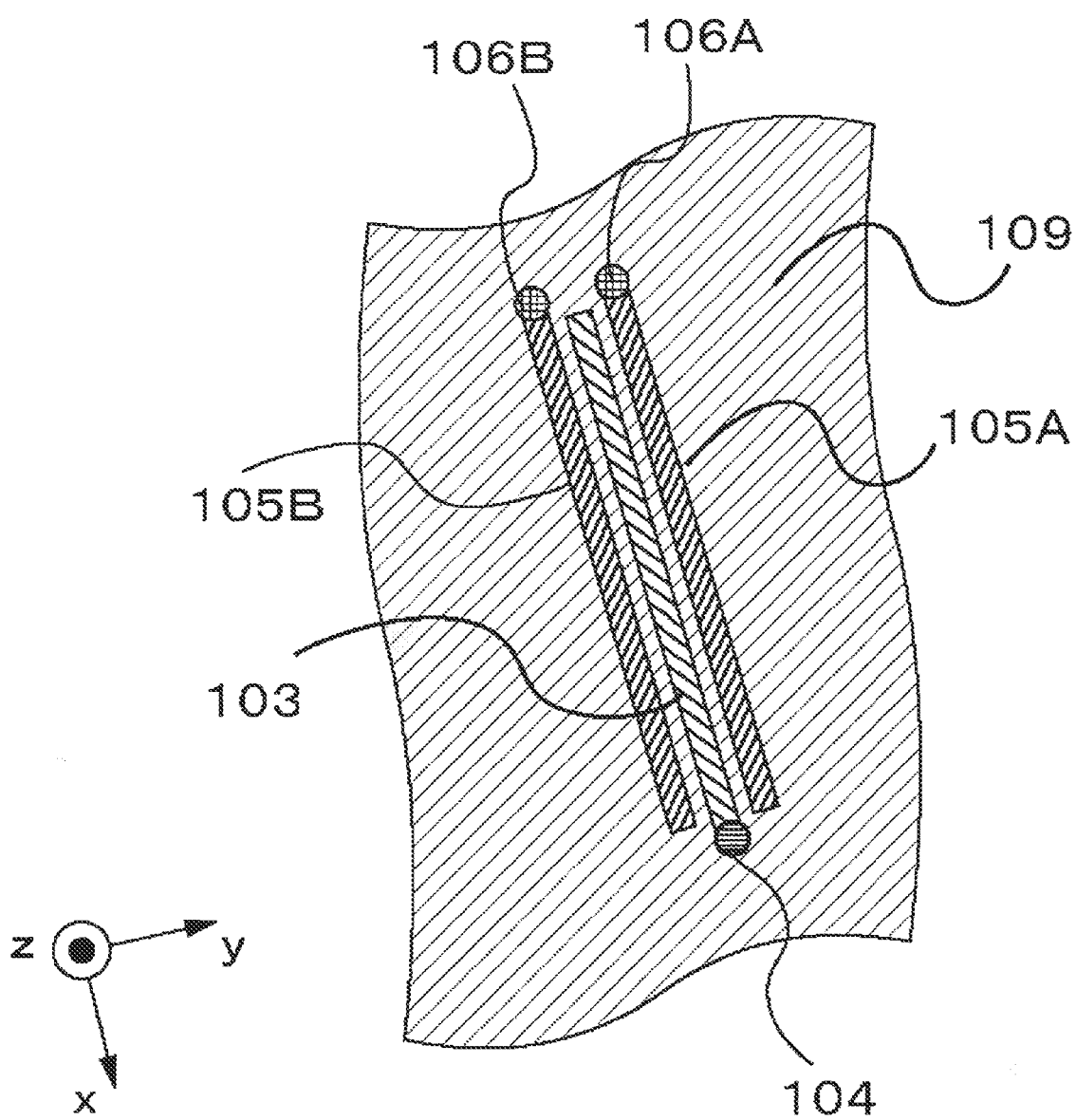

FIG. 21 is a diagram showing an example of a case where both of the second transmission lines 105A and 105B run parallel to the first transmission line 103. In that case, the second transmission line 105B has its one end being an open end, and is electrically connected with the second conductor plane 102 through a second conductor via 106B provided at its other end. When the two second transmission lines 105A and 105B, each having a resonant frequency close to the resonant frequency of the first transmission line 103, run parallel to the first transmission line 103, the single resonant frequency which was split into two in the cases described before, where there was only one second transmission line 105 running parallel to the first transmission line 103, is split into three, and accordingly, further widening of the band gap becomes possible.

Figure 22:
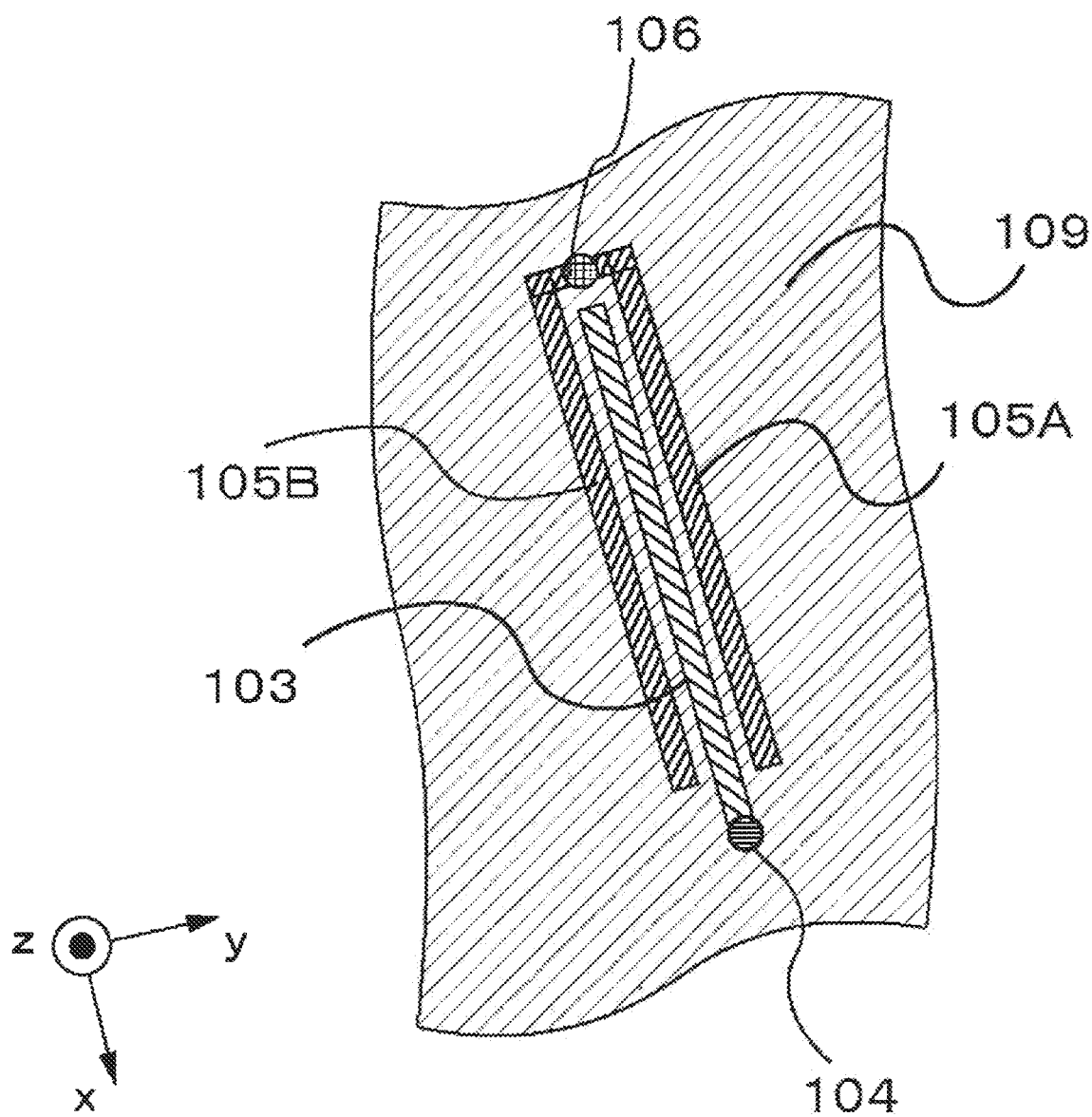
Figure 23:
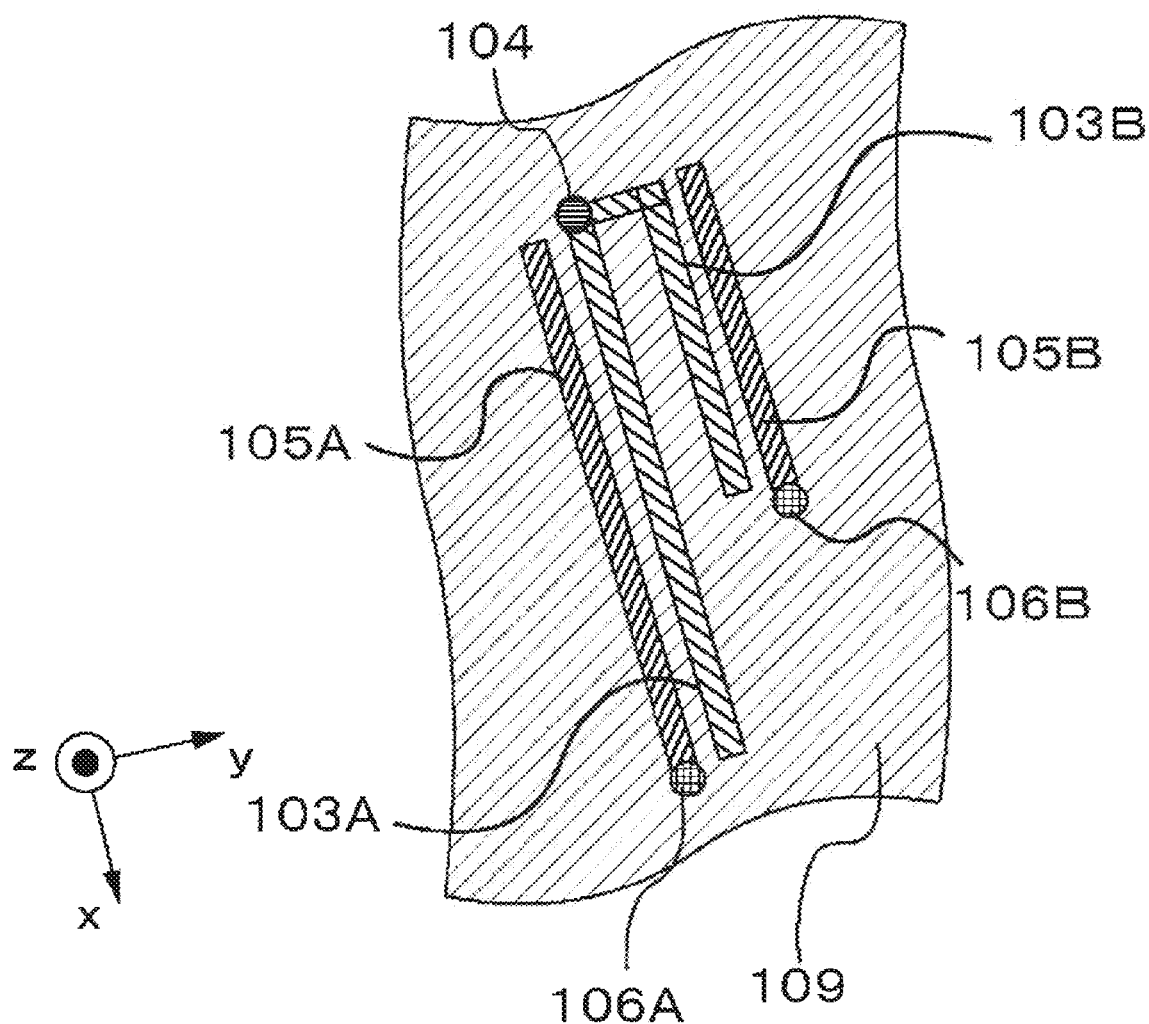

The case shown in FIG. 21 is that of having two independent second conductor vias 106A and 106B which connect the second conductor plane 102 with, respectively, the second transmission line 105A and the second transmission line 105B. However, as shown in FIG. 22, electrical connection of both of the second transmission lines 105A and 105B with the second conductor plane 102 may be made through a common second conductor via 106. In that case, the two second transmission lines 105A and 105B are configured to be connected with each other at the position of the common second conductor via 106.

Furthermore, a configuration having three or more second transmission lines 105 arranged to run parallel to the single first transmission line 103 may be considered. In that case, each of the three or more second transmission lines 105 has its one end being an open end, and is electrically connected with the second conductor plane 102 through a second conductor via 106. Here, the second conductor via 106 may be shared by some ones of the three or more second transmission lines 105. In the present case, the single resonant frequency is split into the same number of resonant frequencies as the number of parallel running second transmission lines 105 which each have a resonant frequency close to that of the first transmission line 103, and accordingly, further widening of the band gap becomes possible. In that case, the large number of parallel running second transmission lines 105 do not necessarily need to have a transmission line length close to that of the first transmission line 103. For example, they may have a length close to ⅓ of that of the first transmission line 103, which corresponds to the second resonance.

In the above descriptions, the lengths of the second transmission lines 105 are prescribed with reference to the length of the first transmission line 103. However, when a structure for adding a capacitor or an inductance is attached to the first transmission line 103 or when the effective dielectric constant is different between the second transmission lines 105 and the first transmission line 103, it is impossible to prescribe the lengths of the second transmission lines 105 simply using the length of the first transmission line 103 as the reference. In such cases, it becomes necessary to prescribe the lengths of the second transmission lines 105 taking into account a resonant frequency at which the first transmission line 103 becomes in a series resonance state, or to design resonant frequencies of the second transmission lines 105 with a capacitor or an inductance added to each of them.

The above descriptions of the present exemplary embodiment have been given of the cases where a transmission line connected with the first conductor via 104 is only the single first transmission line 103. Alternatively, a plurality of first transmission lines 103 may be connected to the single first conductor via 104. In an example shown in FIG. 23, both of first transmission lines 103A and 103B are connected to the first conductor via 104. Each of the first transmission lines 103A and 103B has its one end being an open end, and has its other end connected to the first conductor via 104. The first transmission lines 103A and 103B run parallel with, respectively, the second transmission lines 105A and 105B.

When the transmission line length is different between the first transmission line 103A and 103B, a group of band gaps due to the length of the first transmission line 103A and another group of band gaps due to the length of the first transmission line 103B are generated. In such a case, the configuration may be one which has not only a second transmission line 105A running parallel to the first transmission line 103A but also a second transmission line 105B running parallel to the first transmission line 103B. The parallel running second transmission line 105B has its one end being an open end, and has its other end connected with the second conductor plane 102 through a second conductor via 106B. A resonator constituted by the parallel running second transmission line 105B has resonant frequencies close to that of the first transmission line 103B. An example of such a case is one where the length of the parallel running second transmission line 105B is about $1/(2n-1)$ of that of the first transmission line 103B. In that case, the parallel running second transmission line 105B functions to widen the group of band gaps due to the first transmission line 103B.

Figure 24:
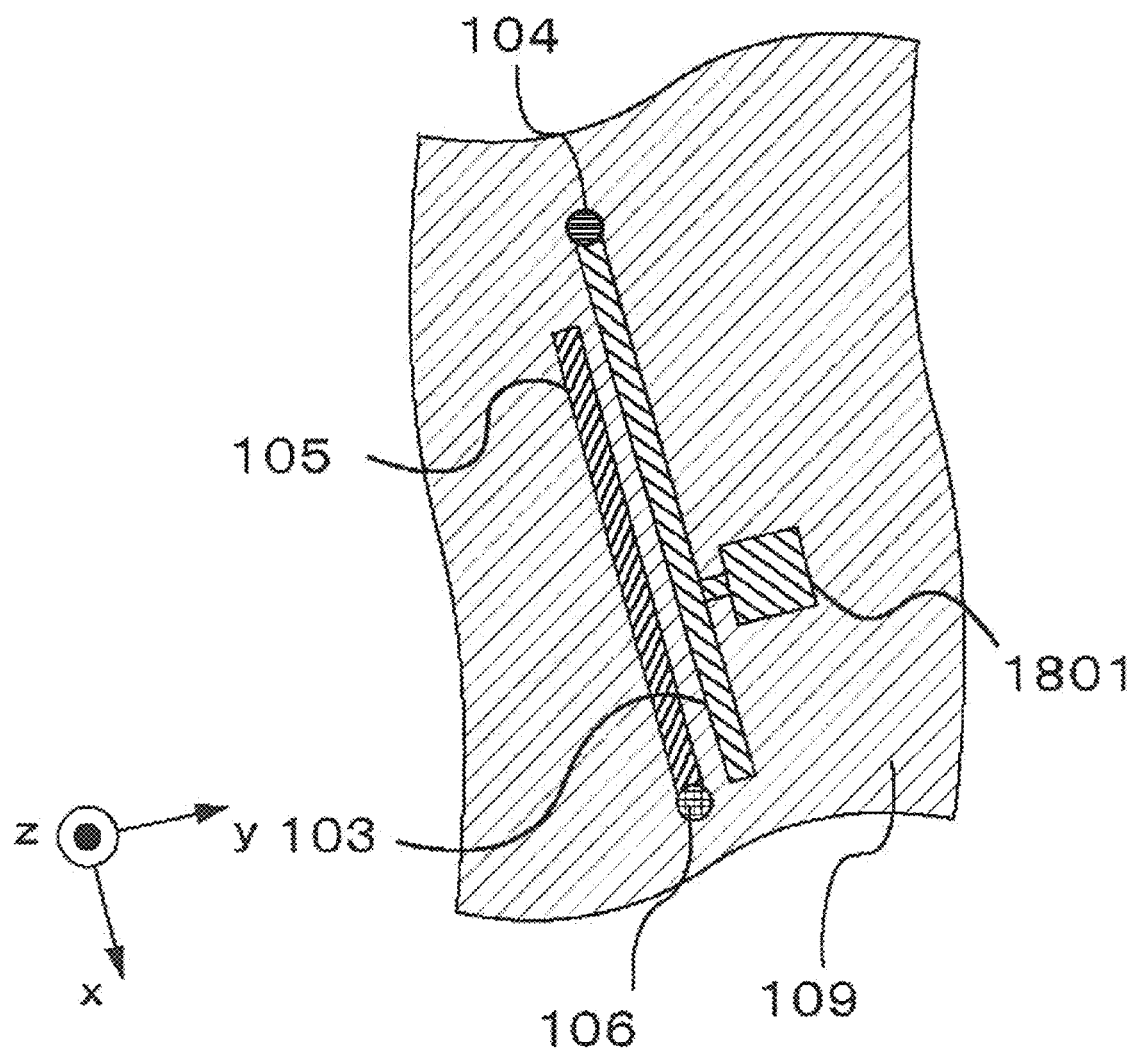
Figure 25:
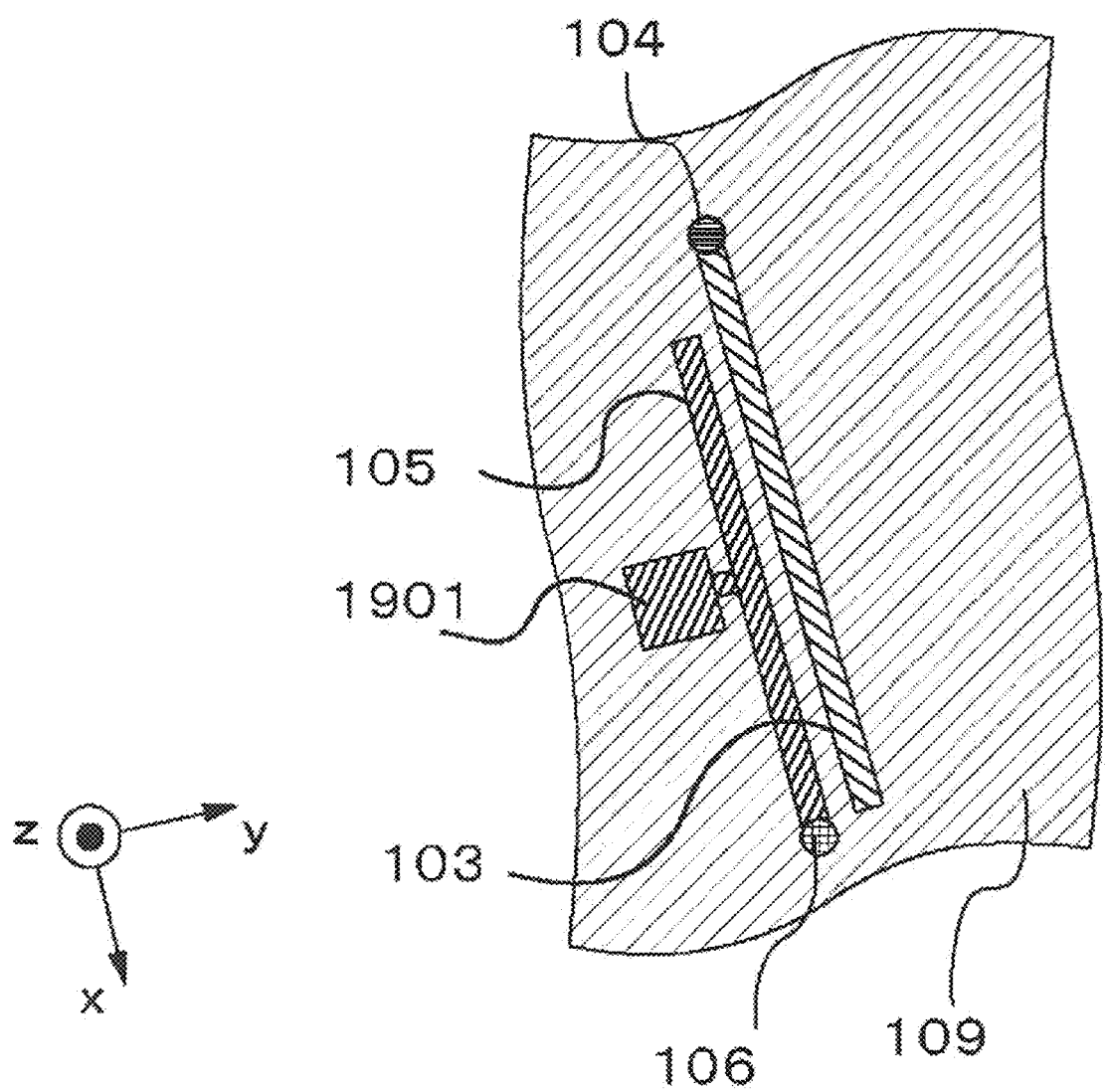

Another configuration which may also be considered is one where, as shown in FIG. 24, a structure 1801 for adding a capacitance is attached to the first transmission line 103 of the present exemplary embodiment. In such a configuration, by the structure 1801 for adding a capacitance, the resonant frequency due to the first transmission line 103 is changed, and the band gap frequency is accordingly changed. In such a case, the transmission line length of the second transmission line 105 cannot be determined simply with reference to the length of the first transmission line 103. It is necessary to consider the resonant frequency of a resonator constituted by the first transmission line 103 and then to design a parameter such as the length of the second transmission line 105 such that the resonant frequency of a resonator constituted by the second transmission line 105 becomes close to the resonant frequency due to the first transmission line 103. In the case of such a configuration, the electrical length of the first transmission line 103 is increased by the effect of the structure 1801 for adding a capacitance, and accordingly, size reduction of the structure becomes possible. The configuration just shown above is that where the structure 1801 for adding a capacitance is attached to the first transmission line 103. Alternatively, a configuration having a structure 1901 for adding a capacitance attached to the second transmission line 105 may also be considered, as shown in FIG. 25. While the above description has been given of the configurations with a capacitance added to the transmission lines, it is obvious that a configuration with an inductance added to them may also be considered.

Figure 26:
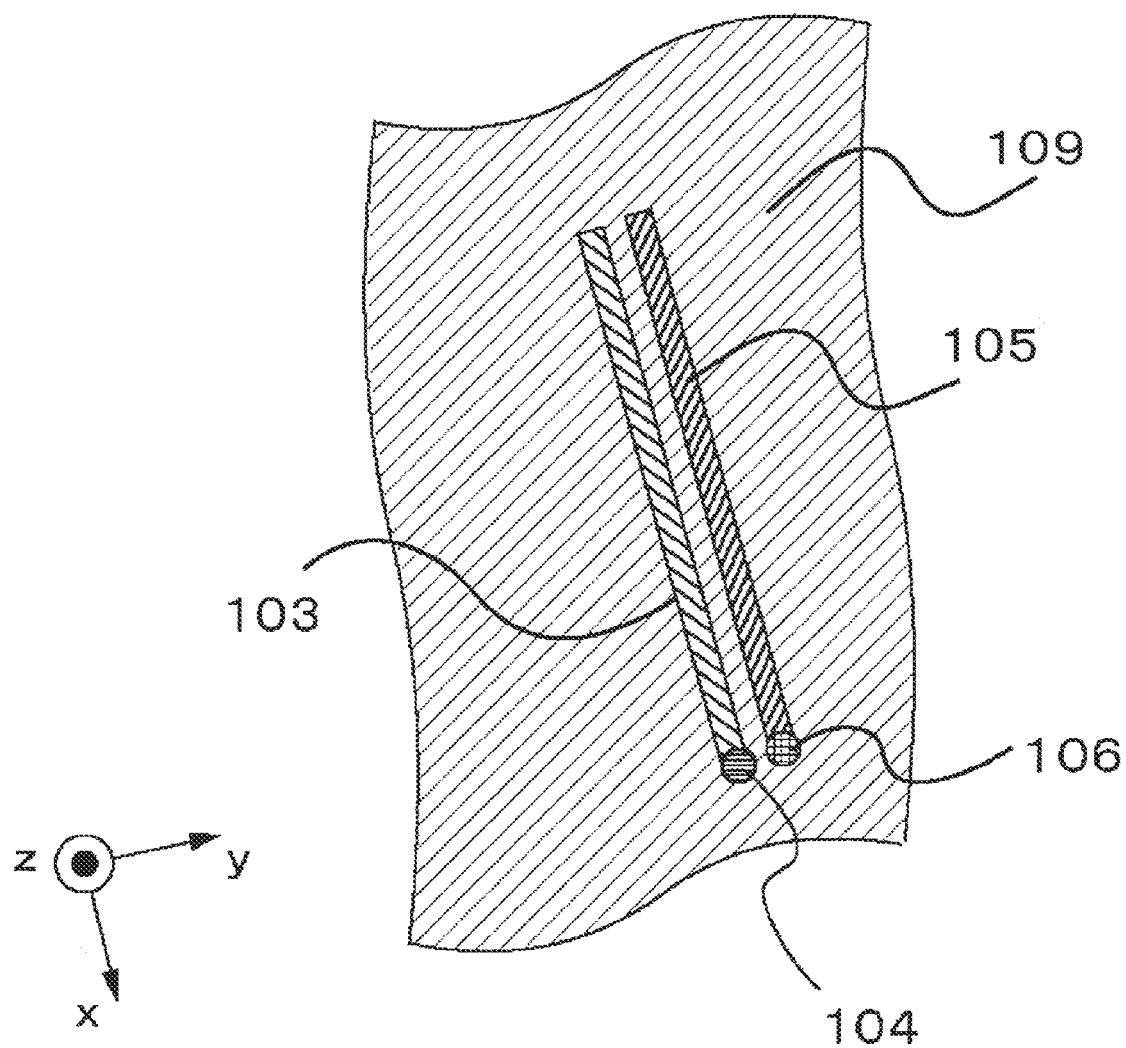

The above descriptions of the present exemplary embodiment have been given of the cases where the end connected with the first conductor via 104 of the first transmission line 103 and the open end of the second transmission line 105 are located on the same side. However, a configuration having both the open end of the first transmission line 103 and that of the second transmission line 105 located on the same side may also be considered, as shown in FIG. 26. That is, assuming that the direction from the open end of the first transmission line 103 toward its other end is defined as a first direction, and the direction from the open end of the second transmission line 105 toward its other end as a second direction, the first and second directions may also be oriented in the same direction, in the part where the first transmission line 103 and the second transmission line 105 run parallel to each other.

Further, while a case of comprising unit cells 107 all having the same configuration is shown in FIG. 1, unit cells having a variety of different configurations such as described above may be mixed together. It is obvious that a unit cell realized by a combination of the above-described various configurations may also be considered.

Second Exemplary Embodiment

Figure 40:
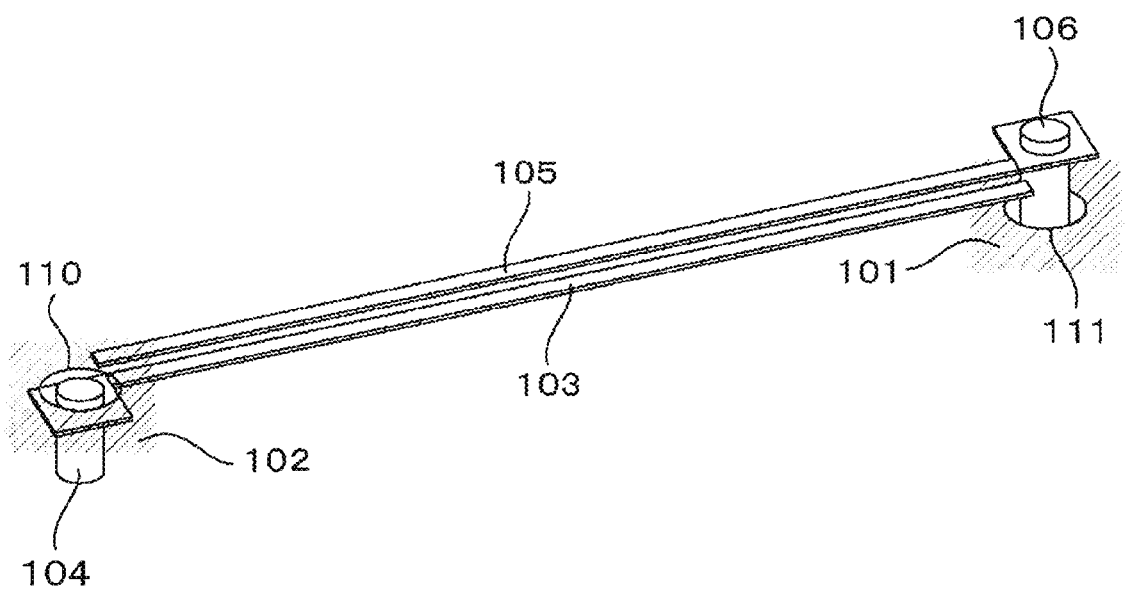
Figure 41:
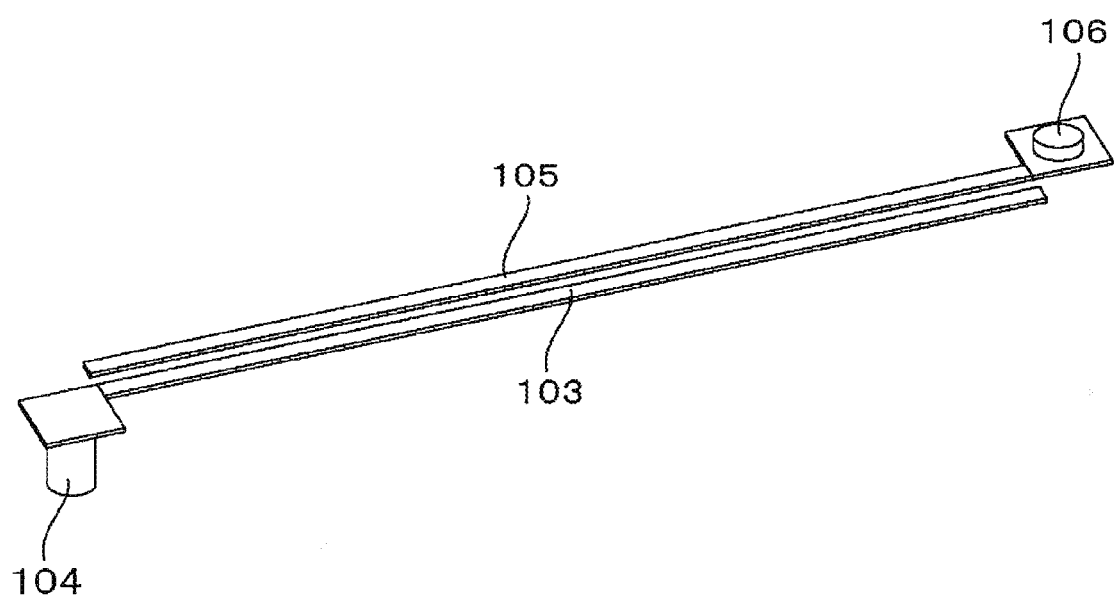

Next, a configuration of a second exemplary embodiment of a structure according to the present invention will be described, with reference to FIGS. 27 to 30 and FIGS. 40 and 41. FIGS. 27 to 30 show examples of a cross-sectional view of a unit cell in the structure of the present exemplary embodiment. FIGS. 40 and 41 show examples of a perspective view of a unit cell in the structure of the present exemplary embodiment. The structure of the present exemplary embodiment is a modified example of the structure of the first exemplary embodiment described above, and to any constituent element which is the same as that in the above-described first exemplary embodiment, the same sign as that used in the first exemplary embodiment will be assigned, and its description will be omitted here. The present exemplary embodiment also can realize the same operation and effect as that of the first exemplary embodiment.

Figure 27:
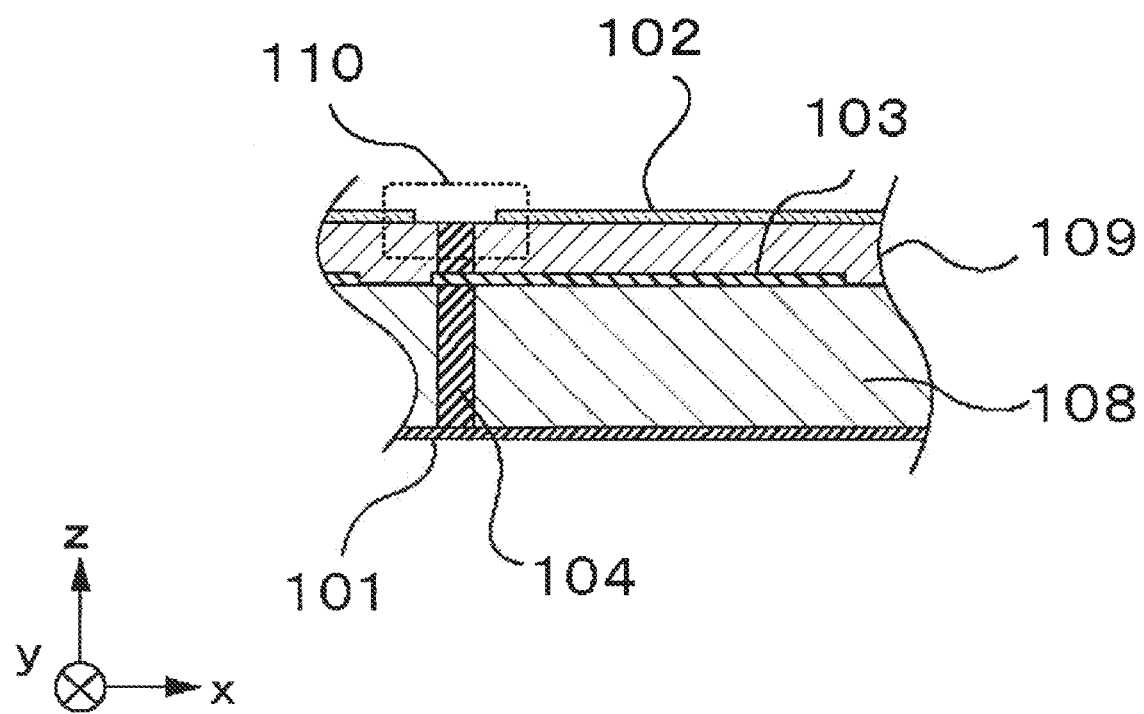
Figure 28:
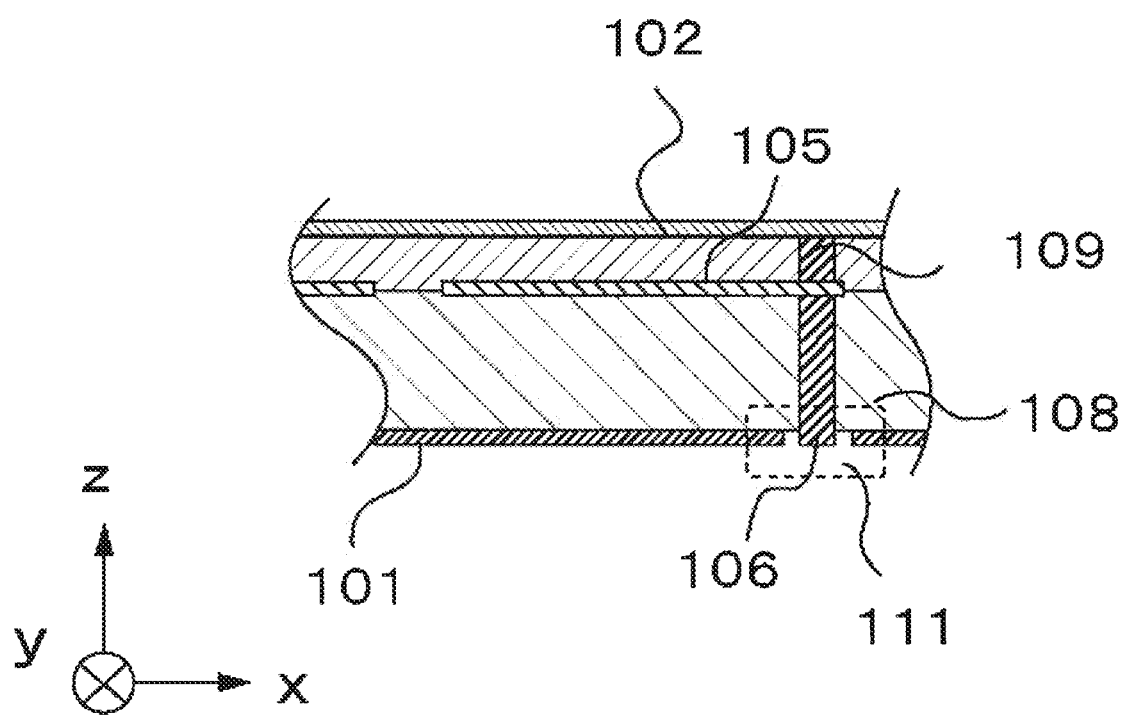

As shown in the cross-sectional views of FIGS. 27 and 28, the structure of the present exemplary embodiment is different from the first exemplary embodiment in that the first transmission line 103 and the second transmission line 105 are arranged in a region sandwiched between the first conductor plane 101 and the second conductor plane 102. An example of a perspective view of the structure of the present exemplary embodiment in that case is shown in FIG. 40. Describing specifically, in the structure of the present exemplary embodiment, the second dielectric layer 109 is laminated over the first dielectric layer 108, the first conductor plane 101 is arranged on the side of a surface not facing to the second dielectric layer 109 of the first dielectric layer 108, and the second conductor plane 102 is arranged on the side of a surface not facing to the first dielectric layer 108 of the second dielectric layer 109. That is, the first dielectric layer 108 and the second dielectric layer 109 are sandwiched by the first conductor plane 101 and the second conductor plane 102. Then, in an intermediate layer sandwiched by the first dielectric layer 108 and the second dielectric layer 109, the first transmission line 103 and the second transmission line 105 are arranged. The first transmission line 103 is a transmission line which is arranged in the plane facing to the second conductor plane 102 and uses the second conductor plane 102 as its return path. Similarly to that in the first exemplary embodiment, the present first transmission line 103 has its one end being an open end and accordingly functions as an open stub. The other end of the first transmission line 103 is electrically connected with the first conductor plane 101 through the first conductor via 104. The second transmission line 105 arranged in the same layer as that of the first transmission line 103 in a manner to run parallel to the first transmission line 103 has its one end being an open end, and its other end is electrically connected with the second conductor plane 102 through the second conductor via 106. In the present case, design is conducted in a manner to make the resonant frequency of a resonator constituted by including the second transmission line 105 become close to a resonant frequency due to the length of the first transmission line 103. For example, the second transmission line 105 is designed to have a length equal to 1/(2n−1) of the length of the first transmission line 103.

In the present exemplary embodiment, arrangement of the unit cell 107, arrangement and shapes of the first transmission line 103 and the second transmission line 105 and arrangement of the first conductor via 104 and the second conductor via 106 are the same as those in the first exemplary embodiment described above.

In the structure of the present exemplary embodiment, the first transmission line 103 and the second transmission line 105 are shielded by the first conductor plane 101 and the second conductor plane 102. As a result, it becomes possible to reduce unnecessary electromagnetic waves radiated out from the first transmission line 103 and the second transmission line 105.

Figure 29:
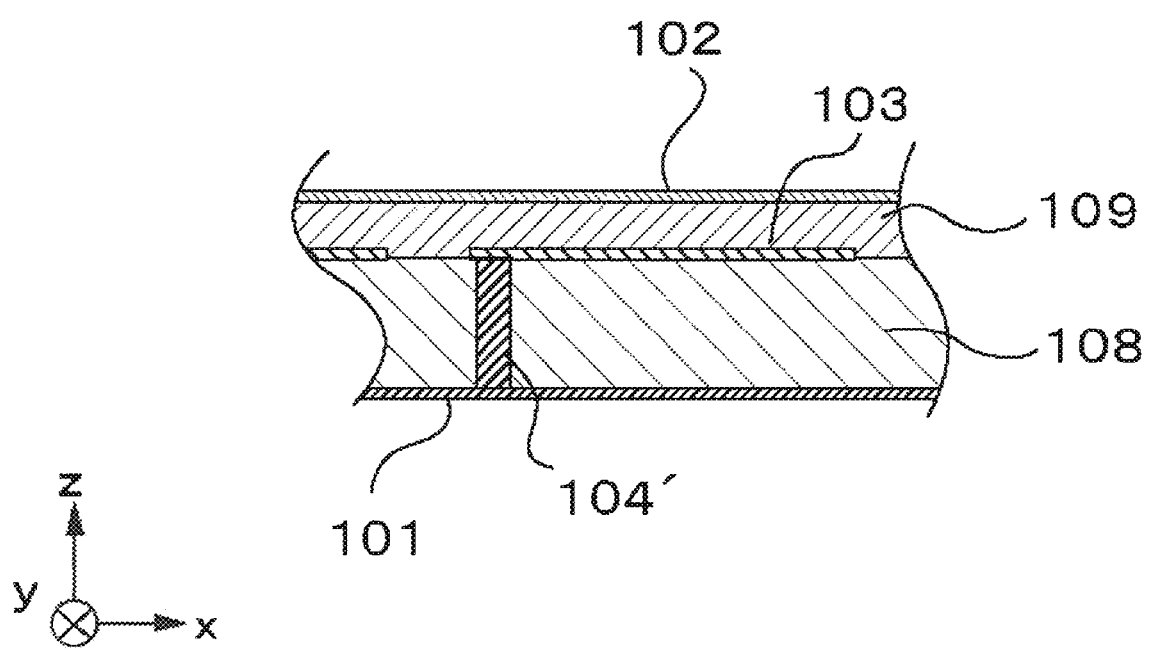
Figure 30:
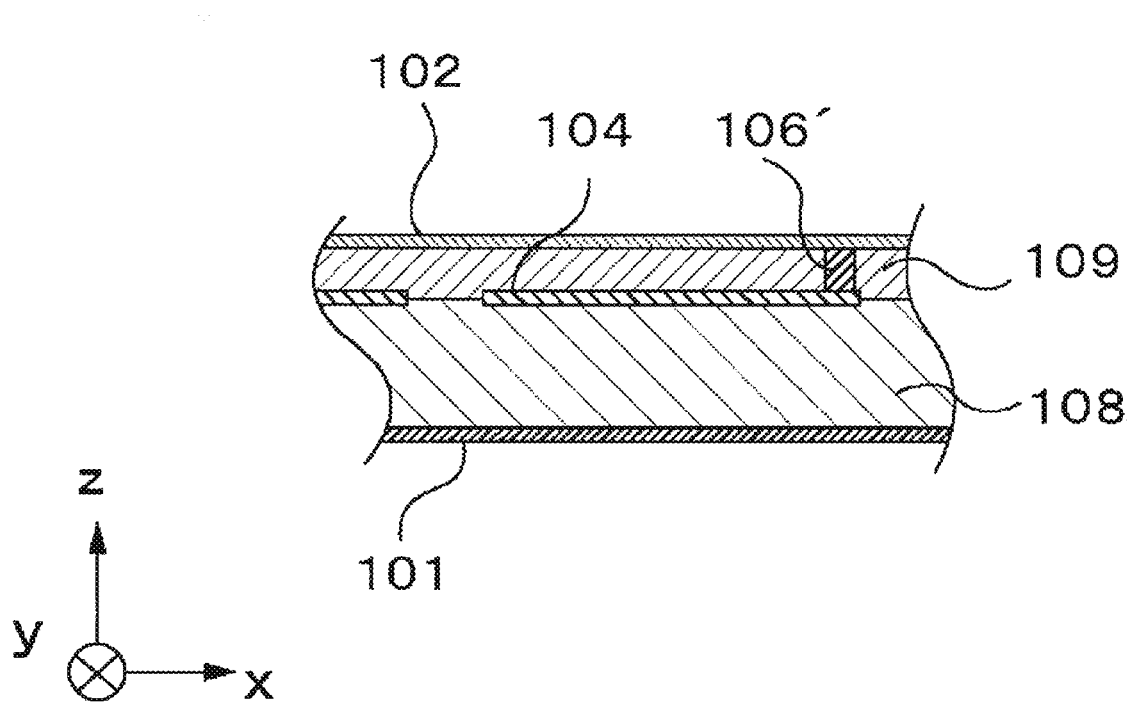

The above description of the present exemplary embodiment has been given of the case where the first conductor via 104 and the second conductor via 106 are through vias, as shown in FIGS. 27 and 28. However, if the first conductor via 104 and the second conductor via 106 are at least electrically connected with, respectively, the first conductor plane 101 and the second conductor plane 102, the two vias do not necessarily need to be through vias (vias penetrating through both the first dielectric layer 108 and the second dielectric layer 109. The same hereinafter.). For example, even if a first conductor via 104' and a second conductor via 106' are arranged each in a form of a non-through via, as shown in FIGS. 29 and 30, the modification exerts no influence on the effect of the present exemplary embodiment. For a structure of the present exemplary embodiment in that case, an example of a perspective view is shown in FIG. 41.

In the case of the structure shown in FIGS. 29 and 30, it becomes unnecessary to provide clearances 110 and 111 in, respectively, the second conductor plane 102 and the first conductor plane 101, and accordingly, electromagnetic wave radiation from the parts corresponding to the clearances 110 and 111 to the outside can be eliminated.

Third Exemplary Embodiment

Figure 31:
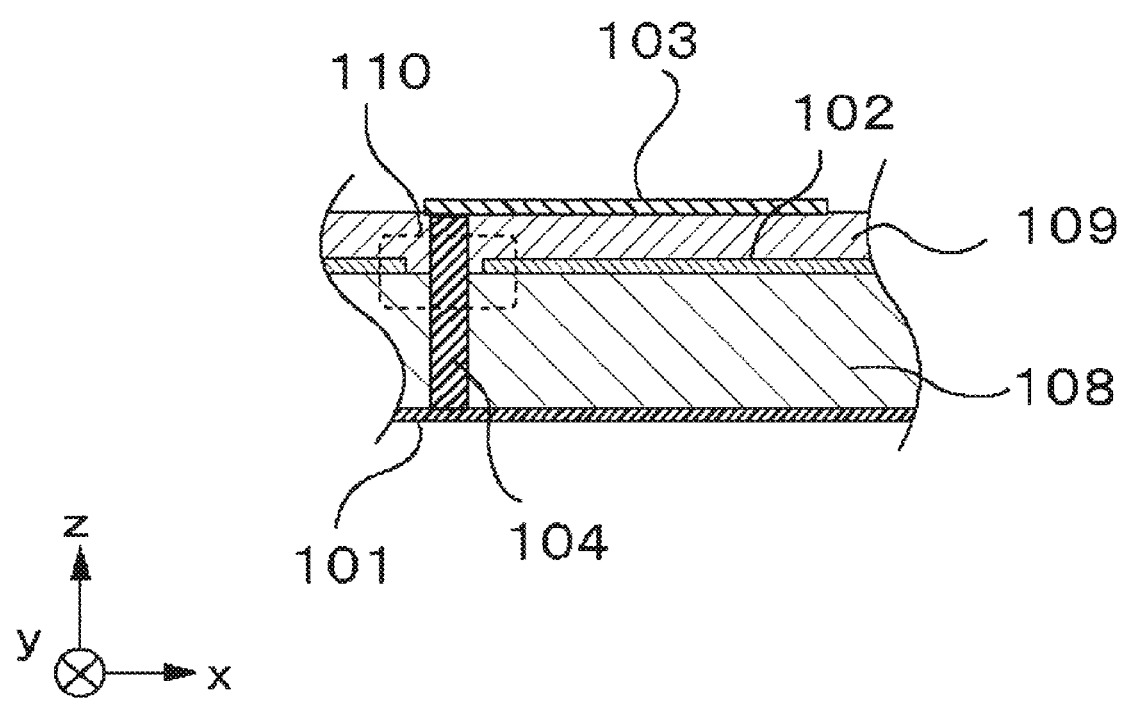
Figure 32:
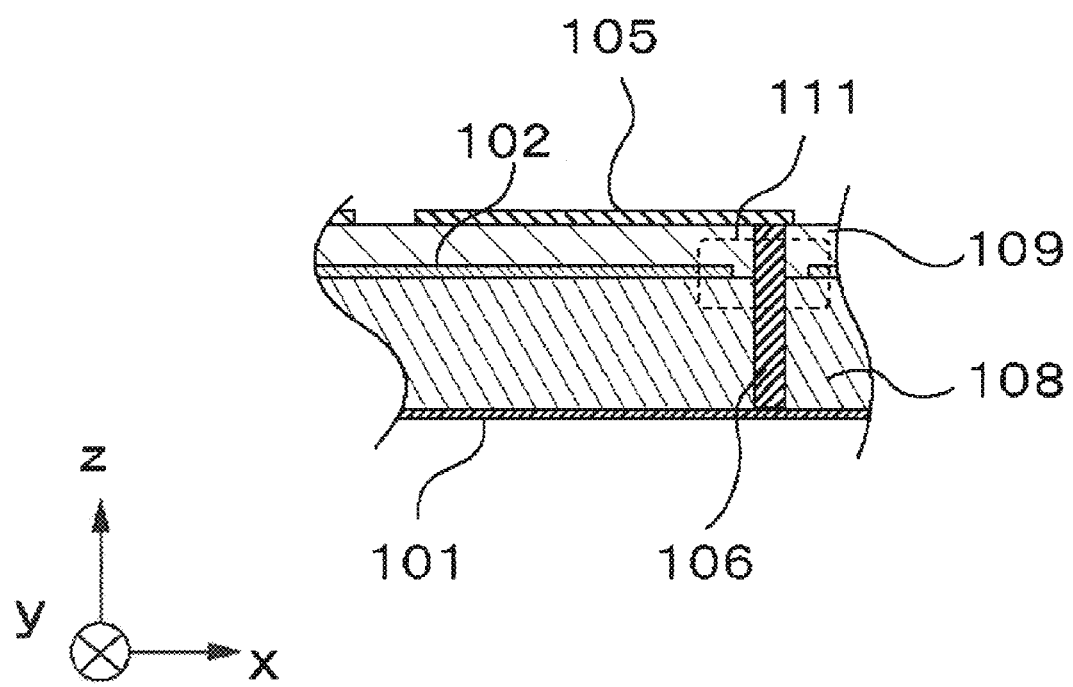
Figure 42:
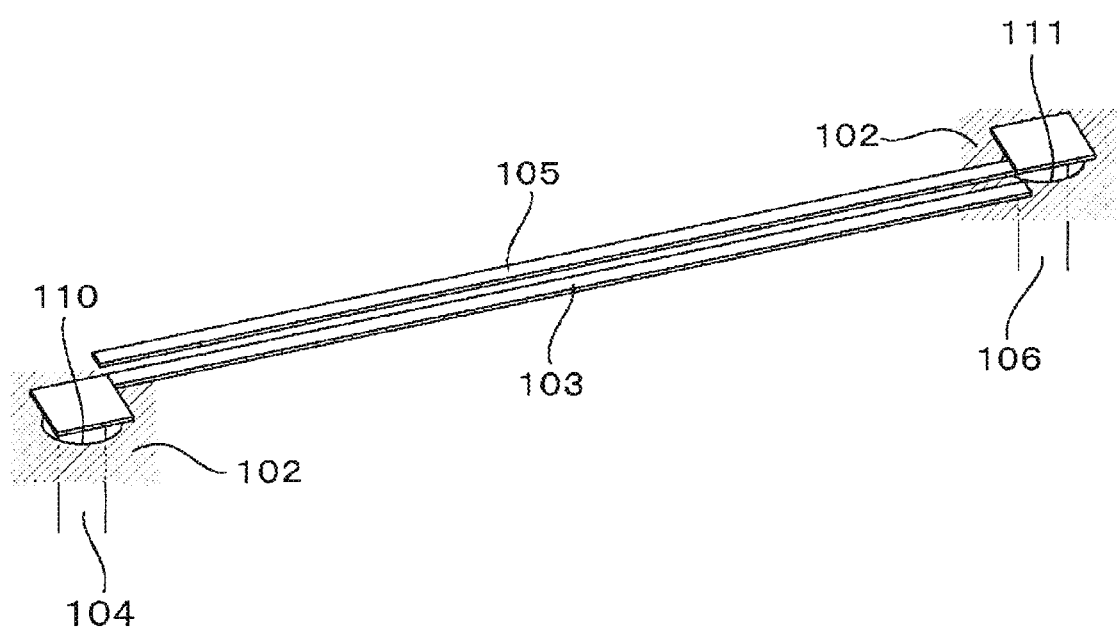

Next, a configuration of a third exemplary embodiment of a structure according to the present invention will be described, with reference to FIGS. 31 to 33 and FIG. 42. FIGS. 31 and 32 each show a cross-sectional view of a unit cell in a structure of the present exemplary embodiment. FIG. 42 shows an example of a perspective view of the unit cell in the structure of the present exemplary embodiment. The structure of the present exemplary embodiment is a modified example of the structure in the first exemplary embodiment described above, and to any constituent element which is the same as that in the above-described first exemplary embodiment, the same sign as that used in the first exemplary embodiment will be assigned, and its description will be omitted here. The present exemplary embodiment also can realize the same operation and effect as that in the first exemplary embodiment.

As shown in FIGS. 31, 32 and 42, the structure of the present exemplary embodiment is different from that of the first exemplary embodiment in that the second transmission line 105 is electrically connected with only the first conductor plane 101 and accordingly is electrically isolated from the second conductor plane 102. That is, the second conductor via 106 provided at the other end of the second transmission line 105 is arranged in a manner to electrically connect the first conductor plane 101 with the other end of the second transmission line 105.

Describing specifically, in the structure of the present exemplary embodiment, the second dielectric layer 109 is laminated over the first dielectric layer 108, the first conductor plane 101 is arranged on the side of a surface not facing to the second dielectric layer 109 of the first dielectric layer 108, and the second conductor plane 102 is arranged between the first dielectric layer 108 and the second dielectric layer 109. Then, on the side of a surface not facing to the first dielectric layer 108 of the second dielectric layer 109, the first transmission line 103 and the second transmission line 105 are arranged. The first transmission line 103 is a transmission line which is arranged in the plane facing to the second conductor plane 102 and uses the second conductor plane 102 as its return path. Similarly to that in the first exemplary embodiment, the present first transmission line 103 has its one end being an open end and accordingly functions as an open stub. The other end of the first transmission line 103 is electrically connected with the first conductor plane 101 through the first conductor via 104. The second transmission line 105 arranged in the same layer as that of the first transmission line 103 in a manner to run parallel to the first transmission line 103 has its one end being an open end. The other end of the second transmission line 105 is electrically connected with the first conductor plane 101 through the second conductor via 106. The connection relationship for the second conductor via 106 is different from that in the first exemplary embodiment.

In the present exemplary embodiment, arrangement of the unit cell 107, arrangement and shapes of the first transmission line 103 and the second transmission line 105 and arrangement of the first conductor via 104 and the second conductor via 106 are the same as those in the first exemplary embodiment described above, except for the difference in connection relationship for the second conductor via and matters additionally described below.

In the structure of the present exemplary embodiment, the second transmission line 105 and the second conductor via 106 have the same connection relationship as that between the first transmission line 103 and the first conductor via 104, and accordingly, an EBG characteristic is obtained even by only the second transmission line 105 and the second conductor via 106. That is, the combination of the first transmission line 103 and the first conductor via 104 and the combination of the second transmission line 105 and the second conductor via 106, each having an EBG characteristic, are arranged close to each other, they are accordingly coupled with each other through an electromagnetic field, and as a result, widening of the band gap is achieved. Resulting from the fact that each of the combinations inherently has an EBG characteristic, the noise suppression effect can be enhanced compared to the structures described in the first and second exemplary embodiments.

Figure 33:
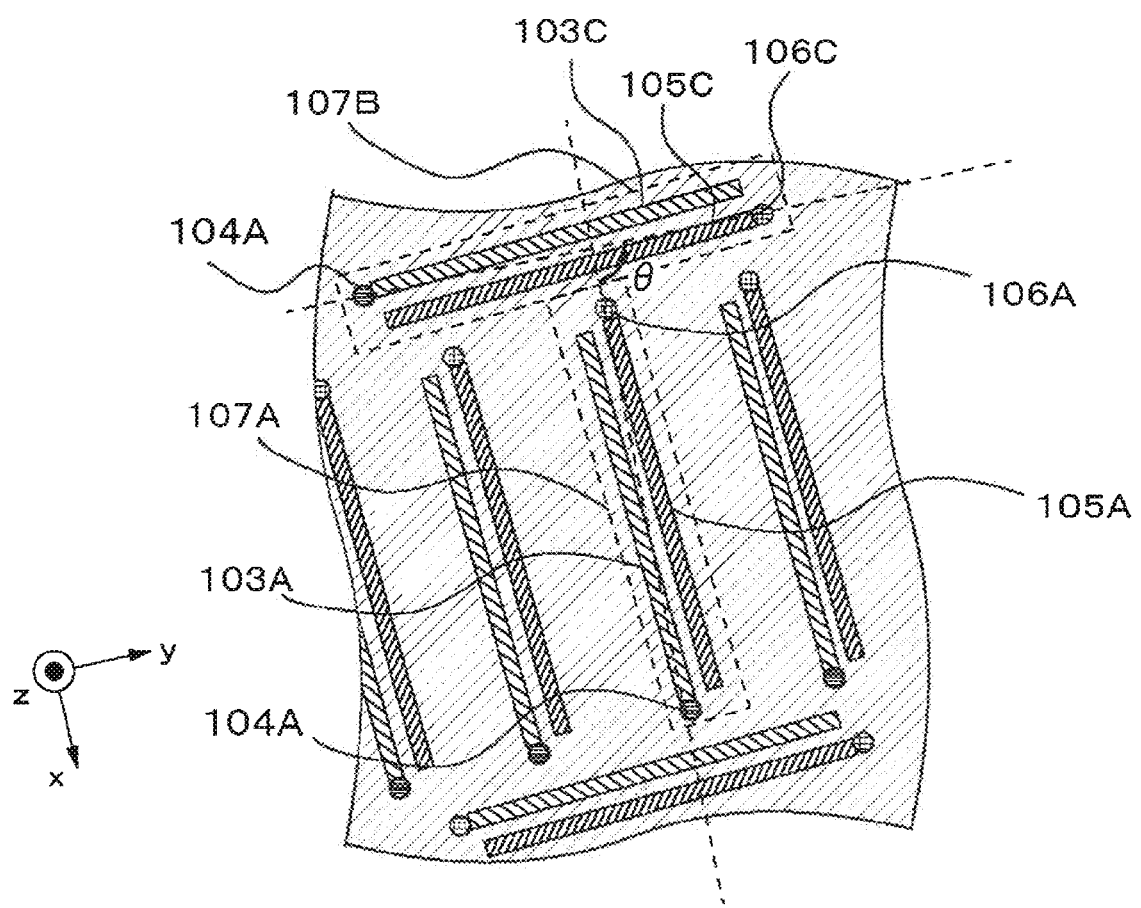

In the structure of the present exemplary embodiment, differently from the structures of the first and second exemplary embodiments, with respect to electromagnetic waves propagating in the y-axis direction of FIG. 1, no coupling through an electromagnetic field is generated between the first transmission line 103 and the second transmission line 105, and accordingly, the effect of widening the band gap range is not achieved. It results from the fact that electromagnetic waves propagating in the y-axis direction excite a resonator constituted by the first transmission line 103 and that by the second transmission line 105 in phase with each other. Positions for the excitation are the locations of the conductor vias. In this respect, as shown in FIG. 33, a second unit cell 107B different from a first unit cell 107A is provided here, where an angle θ, which is made by a straight line connecting a first conductor via 104A with a second conductor via 106A, in the first unit cell 107A, and by a straight line connecting a first conductor via 104C with a second conductor via 106C, in the second unit cell 107B, is set to have a large value (as θ, an angle on the side of its being 0 to 90 degrees is referred to). By doing that way, it becomes possible, with respect to electromagnetic waves propagating in any direction in the x-y plane, to realize widening of the band gap range of the EBG. Here, the large value may be, for example, 45 degrees or larger. In that case, the second unit cell 107B functions as an "EBG with its band gap range widened" with respect to electromagnetic waves propagating in the y-axis direction, and the first unit cell 107A functions in the same way with respect to electromagnetic waves propagating in the x-axis direction.

Fourth Exemplary Embodiment

Figure 43:
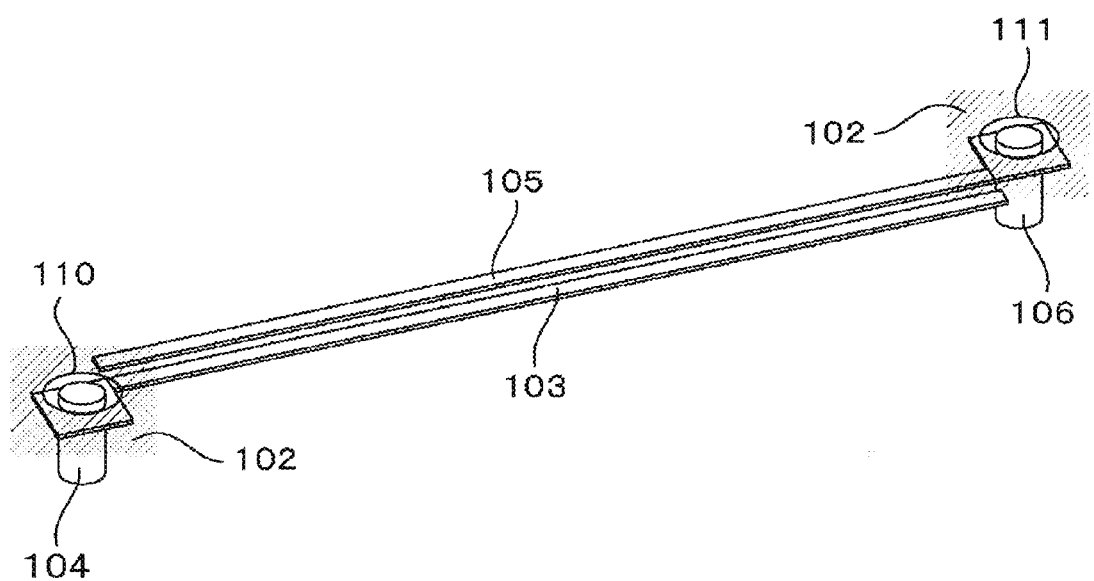
Figure 44:
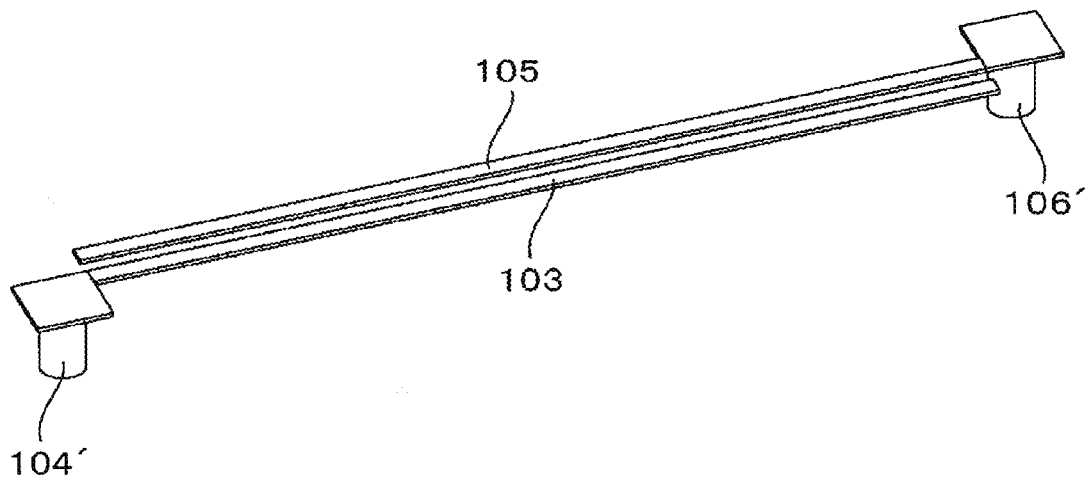

Next, a configuration of a fourth exemplary embodiment of a structure according to the present invention will be described, with reference to FIGS. 34 to 37 and FIGS. 43 and 44. FIGS. 34 to 37 each show an example of a cross-sectional view of a unit cell in the structure of the present exemplary embodiment. FIGS. 43 and 44 each show an example of a perspective view of a unit cell in the structure of the present exemplary embodiment. The structure of the present exemplary embodiment is a modified example of the structure of the third exemplary embodiment, which is based on the first exemplary embodiment described above, and to any constituent element which is the same as that in the above-described first exemplary embodiment, the same sign as that used in the first exemplary embodiment will be assigned, and its description will be omitted here. The present exemplary embodiment also can realize the same operation and effect as that of the first exemplary embodiment.

Figure 34:
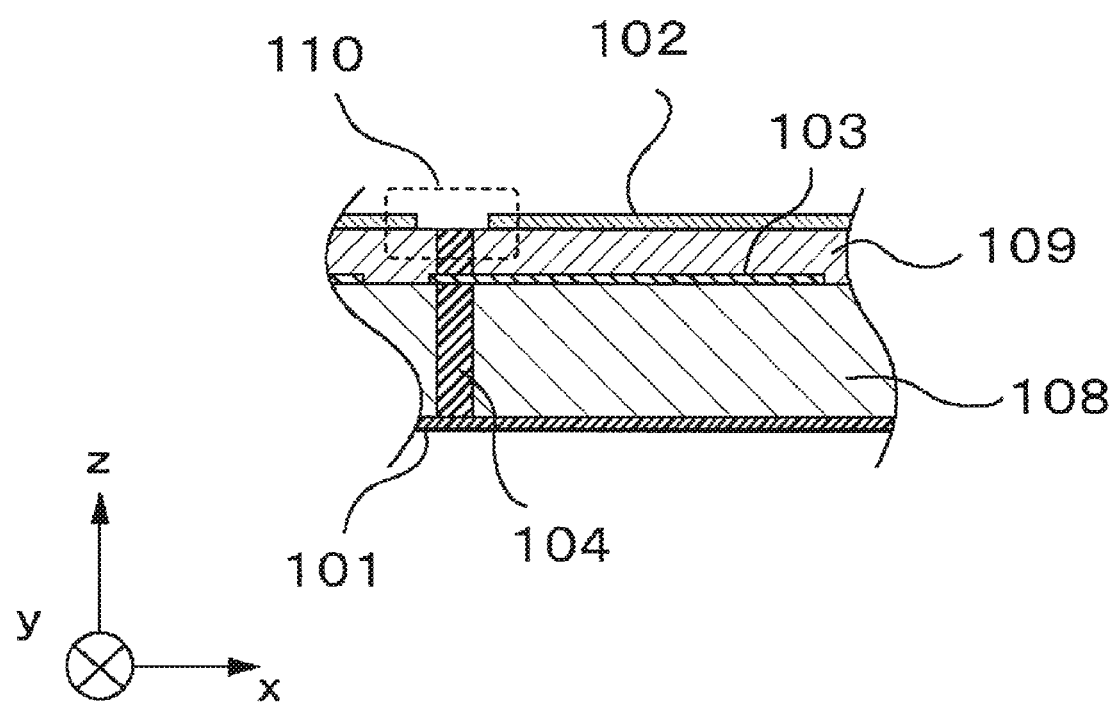
Figure 35:
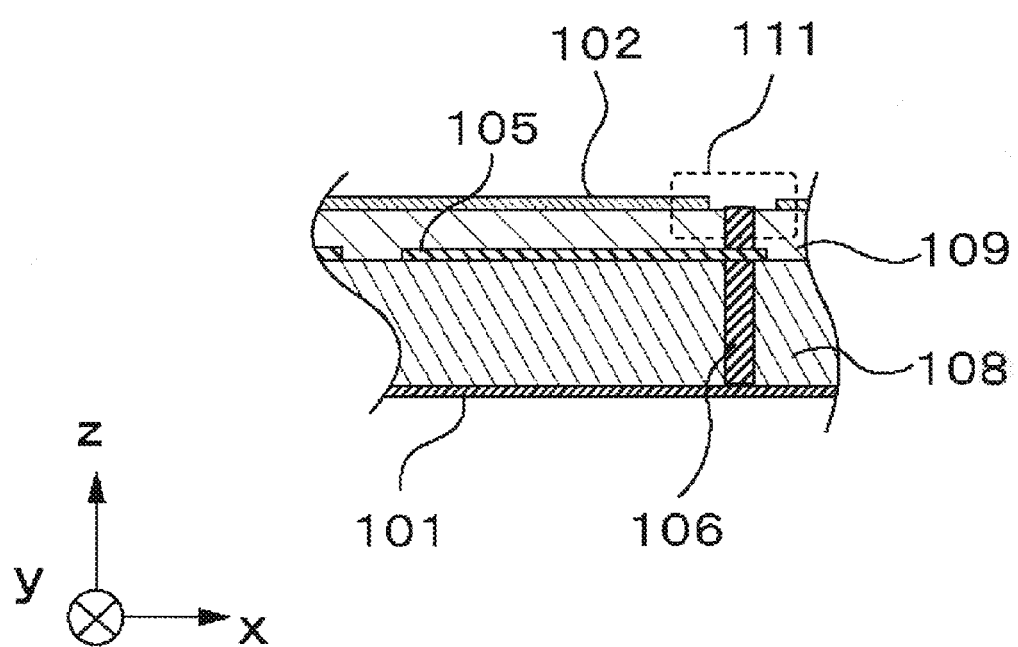

As shown in FIGS. 34, 35 and 43, the structure of the present exemplary embodiment is different from that of the first exemplary embodiment in that the second transmission line 105 is electrically connected with only the first conductor plane 101 and accordingly is electrically isolated from the second conductor plane 102. That is, the second conductor via 106 provided at the above-defined other end of the second transmission line 105 is arranged in a manner to electrically connect the first conductor plane 101 with the other end of the second transmission line 105. The structure of the present exemplary embodiment is different from that of the third exemplary embodiment in that the first transmission line 103 and the second transmission line 105 are arranged within a region sandwiched by the first conductor plane 101 and the second conductor plane 102.

Describing specifically, in the structure of the present exemplary embodiment, the second dielectric layer 109 is laminated over the first dielectric layer 108, the first conductor plane 101 is arranged on the side of a surface not facing to the second dielectric layer 109 of the first dielectric layer 108, and the second conductor plane 102 is arranged on the side of a surface not facing to the first dielectric layer 108 of the second dielectric layer 109. That is, the first dielectric layer 108 and the second dielectric layer 109 are sandwiched by the first conductor plane 101 and the second conductor plane 102. Then, in an intermediate layer sandwiched between the first dielectric layer 108 and the second dielectric layer 109, the first transmission line 103 and the second transmission line 105 are arranged. The first transmission line 103 is a transmission line which is arranged in the plane facing to the second conductor plane 102 and uses the second conductor plane 102 as its return path. Similarly to that in the first exemplary embodiment, the present first transmission line 103 has its one end being an open end and accordingly functions as an open stub. The other end of the first transmission line 103 is electrically connected with the first conductor plane 101 through the first conductor via 104.

The second transmission line 105 arranged in the same layer as that of the first transmission line 103 in a manner to run parallel to the first transmission line 103 has its one end being an open end, and its other end is electrically connected with the first conductor plane 101 through the second conductor via 106. Here, the first conductor via 104 and the second conductor via 106 are electrically isolated from the second conductor plane 102. In the present case, design is conducted in a manner to make the resonant frequency of a resonator constituted by a structure including the second transmission line 105 become close to a resonant frequency due to the length of the first transmission line 103. For example, the second transmission line 105 is designed to have a length equal to 1/(2n−1) of the length of the first transmission line 103.

In the present exemplary embodiment, arrangement of the unit cell 107, arrangement and shapes of the first transmission line 103 and the second transmission line 105 and arrangement of the first conductor via 104 and the second conductor via 106 are the same as those in the first and third exemplary embodiments described above, except for matters additionally described below.

In the structure of the present exemplary embodiment, the first transmission line 103 and the second transmission line 105 are shielded by the first conductor plane 101 and the second conductor plane 102, and as a result, it becomes possible, in addition to the effect described in the third exemplary embodiment, to reduce unnecessary electromagnetic waves radiated out from the first transmission line 103 and the second transmission line 105.

The above description of the present exemplary embodiment has been given of the case where the first conductor via 104 and the second conductor via 106 are through vias, as shown in FIGS. 34, 35 and 43. However, it is only necessary for the first conductor via 104 to electrically connect the first conductor plane 101 with the first transmission line 103, and for the second conductor via 106 to electrically connect the first conductor plane 101 with the second transmission line 105, and accordingly, the two vias do not necessarily need to be through vias. For example, even if a first conductor via 104' and a second conductor via 106' are arranged each in a form of a non-through via, as shown in FIGS. 36, 37 and 44, the modification exerts no influence on the effect of the present exemplary embodiment.

Figure 36:
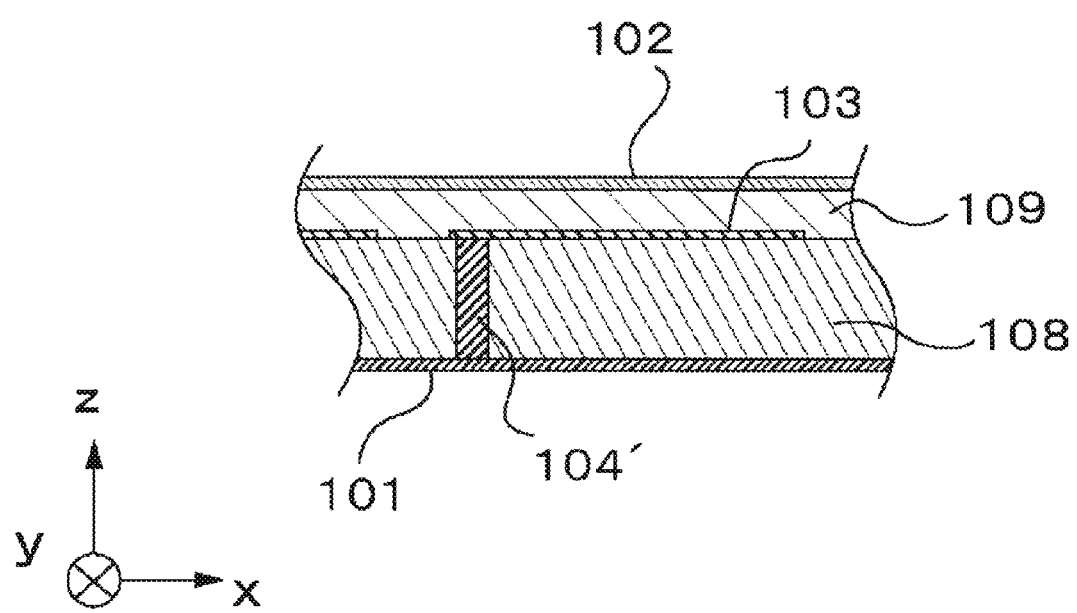
Figure 37:
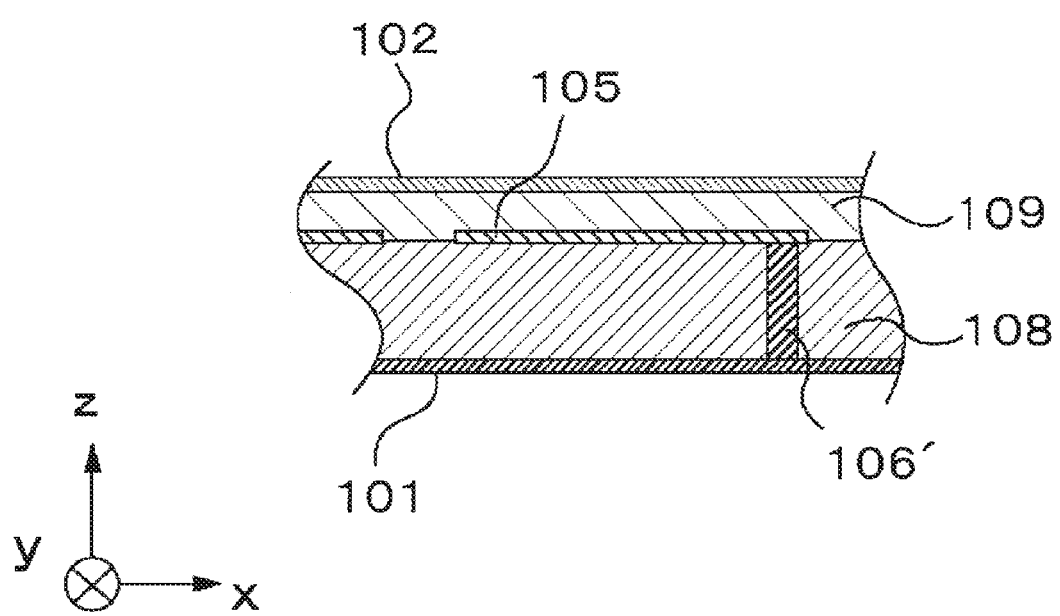

In the case of the structure shown in FIGS. 36, 37 and 44, it becomes unnecessary to provide clearances 110 and 111 in the second conductor plane 102, and accordingly, electromagnetic wave radiation from the parts corresponding to the clearances 110 and 111 to the outside can be eliminated.

According to a wiring board having any of the structures described above and to an electronic device comprising the wiring board, the same operations and effects as those described above can be realized.

<<Supplementary Notes>>

Part or the whole of the exemplary embodiments described above can be described as, but not limited to, the following supplementary notes.

1. A structure characterized by that it comprises:
a first and a second conductor planes which are arranged in different layers and in a manner to face to each other;
a first transmission line which is arranged in a different layer from those of said first conductor plane and of said second conductor plane, faces to said second conductor plane, and has its one end being an open end;
a first conductor via which connects the other end of said first transmission line with said first conductor plane;
a second transmission line which is formed in the same layer as that of said first transmission line, runs parallel to said first transmission line, and has its one end being an open end; and
a second conductor via which electrically connects the other end of said second transmission line with either said first conductor plane or said second conductor plane.

2. The structure according to supplementary note 1, wherein
an EBG structure is constituted by said first conductor plane, said second conductor plane, said first transmission line, said second transmission line, said first conductor via and said second conductor via.

3. The structure according to supplementary notes 1 or 2, which is characterized by that
a plurality of said second transmission lines run parallel to a single said first transmission line.

4. The structure according to any one of supplementary notes 1 to 3, which is characterized by that
said second conductor via connects said second conductor plane with said second transmission line.

5. The structure according to any one of supplementary notes 1 to 4, which is characterized by that,
defining the direction from said open end of said first transmission line toward said other end of said first transmission line as a first direction, and the direction from said open end of said second transmission line toward said other end of said second transmission line as a second direction,
said first and second directions are oriented opposite to each other in a part of the structure where said first transmission line and said second transmission line run parallel to each other.

6. The structure according to any one of supplementary notes 1 to 5, which is characterized by that,
assuming that the interval between said second conductor plane and the layer in which said first transmission line is arranged is represented by h,
the structure includes a part where the interval between said first and second transmission lines running parallel to each other is equal to or smaller than 2h.

7. The structure according to any one of supplementary notes 1 to 6, which is characterized by that,
assuming that the length of said first transmission line is represented by L,
the length of said second transmission line has a value between (L−L/8) and (L+L/8).

8. The structure according to any one of supplementary notes 1 to 6, which is characterized by that,
assuming that the length of said first transmission line is represented by L,
the length of said second transmission line has a value between (L/3−L/8) and (L/3+L/8).

9. A wiring board including a structure, the structure comprising:
a first and a second conductor planes which are arranged in different layers and in a manner to face to each other;
a first transmission line which is arranged in a different layer from those of said first conductor plane and of said second conductor plane, faces to said second conductor plane, and has its one end being an open end;
a first conductor via which connects the other end of said first transmission line with said first conductor plane;
a second transmission line which is formed in the same layer as that of said first transmission line, runs parallel to said first transmission line, and has its one end being an open end; and a second conductor via which electrically connects the other end of said second transmission line with either said first conductor plane or said second conductor plane.

9-2. The wiring board according to supplementary note 9, wherein an EBG structure is constituted by said first conductor plane, said second conductor plane, said first transmission line, said second transmission line, said first conductor via and said second conductor via.

9-3. The wiring board according to supplementary notes 9 or 9-2, which is characterized by that a plurality of said second transmission lines run parallel to a single said first transmission line.

9-4. The wiring board according to any one of supplementary notes 9 to 9-3, which is characterized by that said second conductor via connects said second conductor plane with said second transmission line.

9-5. The wiring board according to any one of supplementary notes 9 to 9-4, which is characterized by that, defining the direction from said open end of said first transmission line toward said other end of said first transmission line as a first direction, and the direction from said open end of said second transmission line toward said other end of said second transmission line as a second direction, said first and second directions are oriented opposite to each other in a part of the structure where said first transmission line and said second transmission line run parallel to each other.

9-6. The wiring board according to any one of supplementary notes 9 to 9-5, which is characterized by that, assuming that the interval between said second conductor plane and the layer in which said first transmission line is arranged is represented by h, the structure includes a part where the interval between said first and second transmission lines running parallel to each other is equal to or smaller than 2h.

9-7. The wiring board according to any one of supplementary notes 9 to 9-6, which is characterized by that, assuming that the length of said first transmission line is represented by L, the length of said second transmission line has a value between (L−L/8) and (L+L/8).

9-8. The wiring board according to any one of supplementary notes 9 to 9-6, which is characterized by that, assuming that the length of said first transmission line is represented by L, the length of said second transmission line has a value between (L/3−L/8) and (L/3+L/8).

10. An electronic device comprising a wiring board including a structure, the structure comprising:

a first and a second conductor planes which are arranged in different layers and in a manner to face to each other;

a first transmission line which is arranged in a different layer from those of said first conductor plane and of said second conductor plane, faces to said second conductor plane, and has its one end being an open end;

a first conductor via which connects the other end of said first transmission line with said first conductor plane;

a second transmission line which is formed in the same layer as that of said first transmission line, runs parallel to said first transmission line, and has its one end being an open end; and a second conductor via which electrically connects the other end of said second transmission line with either said first conductor plane or said second conductor plane.

10-2. The electronic device according to supplementary note 10, wherein an EBG structure is constituted by said first conductor plane, said second conductor plane, said first transmission line, said second transmission line, said first conductor via and said second conductor via.

10-3. The electronic device according to supplementary notes 10 or 10-2, which is characterized by that a plurality of said second transmission lines run parallel to a single said first transmission line.

10-4. The electronic device according to any one of supplementary notes 10 to 10-3, which is characterized by that said second conductor via connects said second conductor plane with said second transmission line.

10-5. The electronic device according to any one of supplementary notes 10 to 10-4, which is characterized by that, defining the direction from said open end of said first transmission line toward said other end of said first transmission line as a first direction, and the direction from said open end of said second transmission line toward said other end of said second transmission line as a second direction, said first and second directions are oriented opposite to each other in a part of the structure where said first transmission line and said second transmission line run parallel to each other.

10-6. The electronic device according to any one of supplementary notes 10 to 10-5, which is characterized by that, assuming that the interval between said second conductor plane and the layer in which said first transmission line is arranged is represented by h, the structure includes a part where the interval between said first and second transmission lines running parallel to each other is equal to or smaller than 2h.

10-7. The electronic device according to any one of supplementary notes 10 to 10-6, which is characterized by that, assuming that the length of said first transmission line is represented by L, the length of said second transmission line has a value between (L−L/8) and (L+L/8).

10-8. The electronic device according to any one of supplementary notes 10 to 10-6, which is characterized by that, assuming that the length of said first transmission line is represented by L, the length of said second transmission line has a value between (L/3−L/8) and (L/3+L/8).

REFERENCE SIGNS LIST

101 a first conductor plane
102 a second conductor plane
103 a first transmission line
104 a first conductor via
105 a second transmission line
106 a second conductor via
107 a unit cell
108 a first dielectric layer
109 a second dielectric layer
110 a first clearance
111 a second clearance
1801 a structure

The invention claimed is:
1. A structure comprising:
a first and a second conductor planes which are arranged in different layers and in a manner to face to each other;

a first transmission line which is arranged in a different layer from those of said first conductor plane and of said second conductor plane, faces to said second conductor plane, and has one end being an open end;
a first conductor via which connects another end of said first transmission line with said first conductor plane and electrically isolated from said second conductor plane;
a second transmission line which is formed in a same layer as that of said first transmission line, runs parallel closely to said first transmission line, and has one end being an open end; and
a second conductor via which electrically connects another end of said second transmission line with either said first conductor plane or said second conductor plane.

2. The structure according to claim 1, wherein an EBG (electromagnetic bandgap) structure is constituted by said first conductor plane, said second conductor plane, said first transmission line, said second transmission line, said first conductor via and said second conductor via.

3. The structure according to claim 1, wherein a plurality of said second transmission lines run parallel to a single said first transmission line.

4. The structure according to claim 1, wherein said second conductor electrically connects said second conductor plane with said second transmission line.

5. The structure according to claim 1, wherein,
defining a direction from said open end of said first transmission line toward said other end of said first transmission line as a first direction, and a direction from said open end of said second transmission line toward said other end of said second transmission line as a second direction,
said first and second directions are oriented opposite to each other in a part of the structure where said first transmission line and said second transmission line run parallel to each other.

6. The structure according to claim 1, wherein,
assuming that an interval between said second conductor plane and a layer in which said first transmission line is arranged is represented by h,
the structure includes a part where the interval between said first and second transmission lines running parallel to each other is equal to or smaller than 2h.

7. The structure according to claim 1, wherein,
assuming that a length of said first transmission line is represented by L,
a length of said second transmission line has a value between (L−L/8) and (L+L/8).

8. The structure according to claim 1, wherein,
assuming that a length of said first transmission line is represented by L,
a length of said second transmission line has a value between (L/3−L/8) and (L/3+L/8).

9. A wiring board including the structure according to claim 1.

10. An electronic device comprising a wiring board including a structure, the structure comprising:
a first and a second conductor planes which are arranged in different layers and in a manner to face to each other;
a first transmission line which is arranged in a different layer from those of said first conductor plane and of said second conductor plane, faces to said second conductor plane, and has one end being an open end;
a first conductor which connects another end of said first transmission line with said first conductor plane and electrically isolated from said second conductor plane;
a second transmission line which is formed in a same layer as that of said first transmission line, runs parallel closely to said first transmission line, and has one end being an open end; and
a second conductor which electrically connects another end of said second transmission line with either said first conductor plane or said second conductor plane.

11. The structure according to claim 1, wherein,
assuming that the interval between said second conductor plane and the layer in which said first transmission line is arranged is represented by h,
the structure includes a part where the interval between said first and second transmission lines running parallel to each other is equal to or smaller than 2h.

12. The structure according to claim 1, wherein,
assuming that the length of the second transmission line is represented by $L_2$,
a parallel running part of a length is equal to or larger than $L_2/4$.

* * * * *